US005990668A

United States Patent [19]
Coleman

[11] Patent Number: 5,990,668
[45] Date of Patent: *Nov. 23, 1999

[54] A.C. POWER SUPPLY HAVING COMBINED REGULATOR AND PULSING CIRCUITS

[75] Inventor: Charles Coleman, Fort Collins, Colo.

[73] Assignee: Sierra Applied Sciences, Inc., Boulder, Colo.

[ * ] Notice: This patent is subject to a terminal disclaimer.

[21] Appl. No.: 09/157,044

[22] Filed: Sep. 18, 1998

Related U.S. Application Data

[63] Continuation-in-part of application No. 08/966,448, Nov. 7, 1997.

[51] Int. Cl.$^6$ .................................................. G05F 1/59
[52] U.S. Cl. ............................................ 323/271; 323/285
[58] Field of Search .................................. 323/220, 223, 323/225, 265, 268, 271, 272, 282, 285, 349, 350, 351; 363/65, 71

[56] References Cited

U.S. PATENT DOCUMENTS

| | | | |
|---|---|---|---|
| 3,305,767 | 2/1967 | Beihl et al. | 323/282 |
| 4,103,324 | 7/1978 | Vandervelden et al. | 363/89 |
| 4,242,629 | 12/1980 | Shvey | 323/282 |
| 4,514,795 | 4/1985 | van der Zwart | 363/71 |
| 4,538,101 | 8/1985 | Shimpo et al. | 323/272 |
| 4,931,169 | 6/1990 | Scherer et al. | 204/298.11 |
| 4,936,960 | 6/1990 | Siefkes et al. | 204/192.38 |
| 4,963,238 | 10/1990 | Siefkes et al. | 204/192.12 |
| 4,981,566 | 1/1991 | Wurczinger | 204/192.13 |
| 5,006,213 | 4/1991 | Sichmann et al. | 204/192.14 |

(List continued on next page.)

FOREIGN PATENT DOCUMENTS

| | | | |
|---|---|---|---|
| 3121389 A1 | 8/1982 | Germany | C23C 15/00 |
| 221202 A1 | 4/1985 | Germany | C23C 14/38 |
| 229160 A1 | 10/1985 | Germany | C23C 14/38 |
| 3919147 A1 | 12/1990 | Germany | C23C 14/35 |
| 4113704 A1 | 10/1992 | Germany | H05H 1/46 |
| 0 553410 A1 | 8/1993 | Germany | C23C 14/35 |
| 57-69324 | 4/1982 | Japan | C23C 15/00 |
| 61-30665 | 2/1986 | Japan | C23C 14/34 |
| 63-190168 | 8/1988 | Japan | C23C 14/34 |
| 3-56671 | 3/1991 | Japan | C23C 14/40 |
| 3-61368 | 3/1991 | Japan | C23C 14/54 |
| 2045 553 | 10/1980 | United Kingdom | H02J 1/00 |

OTHER PUBLICATIONS

"Economical Considerations on Modern Web Sputtering Technology", Beisswenger, T. et al., Society of Vacuum Coaters, 35$^{th}$ Annual Technical Conference Proceedings, pp. 128–134; (Dec. 1992).

"A New Technique for Arc Control in DC Sputtering", Anderson, L., Society of Vacuum Coaters, 35$^{th}$ Annual Technical Conference Proceedings, pp. 325–329; (Dec. 1992).

"The MDX as a Strategic Tool in Reducing Arcing", Schatz, Doug, Application Notes, Advanced Energy Industries, Inc. (Dec. 1985).

*Primary Examiner*—Jeffrey Sterrett
*Attorney, Agent, or Firm*—Bruce E. Dahl, Esq.; Dahl & Osterloth LLP

[57] ABSTRACT

A circuit for producing an alternating output current may comprise a first current regulator and a second current regulator. The first current regulator produces a first phase of the alternating output current and regulates the current of the first phase. The second current regulator produces a second phase of the alternating output current and regulates the current of the second phase. A first polarity reversing circuit operatively associated with the first current regulator periodically reverses the polarity of the first phase. A second polarity reversing circuit operatively associated with the second current regulator periodically reverses the polarity of the second phase. A control system operatively associated with the first and second current regulators and the first and second polarity reversing circuits controls the operation of the first and second current regulators and the first and second polarity reversing circuits.

26 Claims, 8 Drawing Sheets

U.S. PATENT DOCUMENTS

| | | | |
|---|---|---|---|
| 5,009,764 | 4/1991 | Siefkes et al. | 204/298.08 |
| 5,070,294 | 12/1991 | Nochi | 323/282 |
| 5,074,984 | 12/1991 | Sichmann et al. | 204/192.14 |
| 5,108,571 | 4/1992 | Ludwig et al. | 204/192.13 |
| 5,126,033 | 6/1992 | Szczyrbowski et al. | 204/298.08 |
| 5,192,894 | 3/1993 | Teschner | 315/111.21 |
| 5,402,060 | 3/1995 | Erisman | 323/268 |
| 5,412,308 | 5/1995 | Brown | 323/272 |
| 5,427,669 | 6/1995 | Drummond | 204/192.13 |
| 5,552,695 | 9/1996 | Schwartz | 323/272 |
| 5,602,724 | 2/1997 | Balakrishnan | 363/21 |
| 5,889,391 | 3/1999 | Coleman | 323/271 |

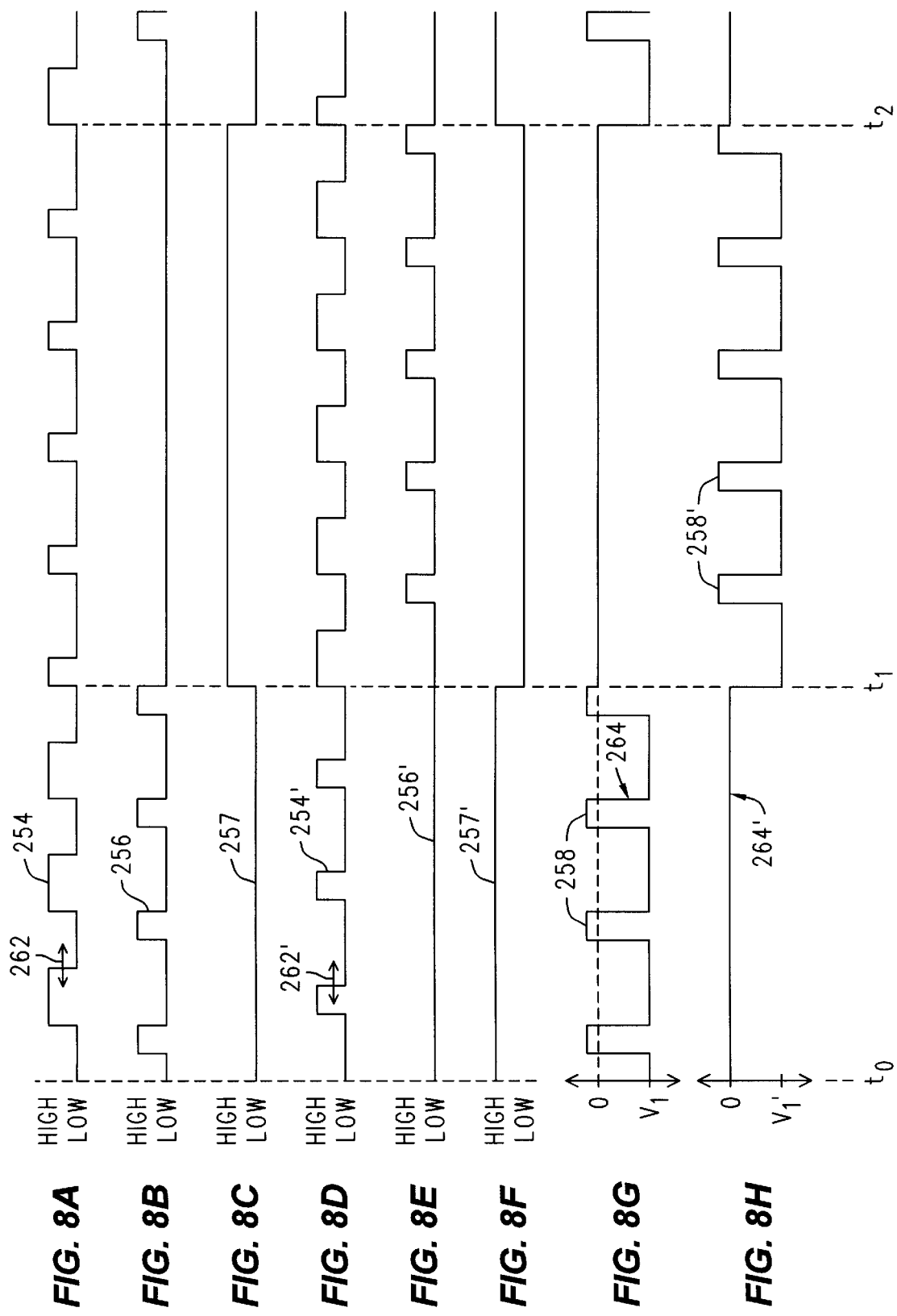

A.C. POWER SUPPLY HAVING COMBINED REGULATOR AND PULSING CIRCUITS

CROSS REFERENCE TO RELATED APPLICATION

This is a continuation in part of co-pending U.S. application, Ser. No. 08/966,448, filed on Nov. 7, 1997, which is incorporated herein by reference for all that it discloses.

FIELD OF INVENTION

The present invention relates to power supplies for plasma processing systems in general and more specifically to power supplies for sputter deposition systems.

BACKGROUND

Plasma deposition refers to any of a wide variety of processes in which a plasma is used to assist in the deposition of thin films or coatings onto the surfaces of objects. For example, plasma deposition processes are widely used in the electronics industry to fabricate integrated circuits and other electronic devices, as well as to fabricate the magnetic tapes and disks used in audio, video, and computer applications. Plasma deposition processes may also be used to apply coatings to various objects to improve or change the properties of the objects. For example, plasma deposition processes may be used to apply wear resistant coatings to machine tools, while other types of coatings may be used to increase the corrosion resistance of other items, such as bearings, turbine blades, etc, thereby enhancing their performance. In still other applications, plasma deposition may be used to apply coatings to various types of surfaces in the optics and glass industries.

In most plasma deposition processes the plasma is created by subjecting a low-pressure process gas (e.g., argon) contained within a vacuum chamber to an electric field. The electric field, which is typically created between two electrodes, ionizes the process gas and creates the plasma. In the case of a DC sputter deposition plasma process, the material (commonly referred to as the target) to be deposited on the object or substrate is connected as the negative electrode (i.e., cathode), whereas some other element, commonly the vacuum chamber itself, is connected as the positive electrode or anode. Ionized process gas atoms comprising the plasma are accelerated toward and ultimately impact the negatively charged cathode/target, dislodging or sputtering atoms from the target material. The sputtered atoms subsequently condense on various items in the chamber, including the substrate that is to be coated. The substrate is usually positioned with respect to the target so that a majority of the sputtered target atoms condense on the surface of the substrate.

Sputter deposition processes of the type described above are usually referred to as "non-reactive" processes in that the sputtered atoms deposited on the surface of the substrate do not react with other materials. However, sputter deposition processes have also been developed wherein the target material is sputtered in the presence of a reactive material (e.g., oxygen or nitrogen gas). Such "reactive" sputtering processes may be used to deposit a film comprising the sputtered target material and the reactive species. A wide variety of compounds, such as $SiO_2$, $Al_2O_3$, $Si_3N_4$, and $TiO$, can be deposited by reactive sputter deposition processes.

While reactive sputtering processes are known and have been used for years, they continue to be plagued by the periodic occurrence of electrical discharges or arcs within the vacuum chamber. Such electrical discharges or arcs can take on different forms depending on the characteristics of the sputtering apparatus and on the particular plasma process being used. For example, arcs may occur between the target material, which is typically connected as the cathode in a DC sputtering process, and the substrate itself, certainly causing a defect in the coating, if not ruining the substrate entirely. Alternatively, the arc may occur between the target and some other part of the vacuum chamber, in which case the deleterious effects of the arc are usually less severe, but nevertheless tend to degrade the overall quality of the coating. The arcs can be short lived, lasting only a few milliseconds or so, or may be continuous, again depending on the particular apparatus and process being used. While such arcing can occur in nearly every kind of plasma process, the tendency of such arcs to occur is much greater in reactive processes where the compound film being deposited is an electrical insulator, such as $Al_2O_3$.

Several methods for preventing, or at least reducing the frequency of such arc discharges, rely on the selective control of the power supply used to place the charge on the electrodes. For example, one such method has been to simply turn-off the power supply as soon as an arc is detected, then turn it back on again once the arc has dissipated. While this method can effectively quench sustained arcs, the stored energy in most power supplies takes time to dissipate, increasing the response time, i.e., the time it takes to remove the electrical potential from the electrodes, to the point where such devices cannot effectively quench short duration arc events. Consequently, all that is really accomplished is a reduction in overall deposition rate, with little or no reduction in the adverse effects produced by the arc event itself.

Another control method has been to momentarily interrupt (i.e., disconnect) the power supply from the electrodes during the arc event. While the response time of this method is usually considerably faster, i.e., the voltage can be removed from the electrodes within a few milliseconds or so, it is difficult to dissipate the stored energy in the power supply. Consequently, such methods tend to stress the power supply or switching devices used to disconnect the power supply to the point of burn-out.

Another method of interrupting the voltage placed on the electrodes has been to use a tapped inductor connected in series between one terminal of the power supply and one of the electrodes. When an arc is detected, the center tap of the inductor is momentarily connected to the other terminal of the power supply. This has the effect of momentarily reversing the voltage on the electrodes. In certain cases, the magnitude of the reversed voltage charge is usually sufficient to quench the arc. Unfortunately, however, this method is not effective in suppressing arcs having impedances lower than the impedance of the switching network and center tap, which is a common occurrence. Consequently, the use of such center-tapped inductors has not proven to be a panacea.

While other devices exist and are being used with some degree of success, none are without their disadvantages. For example, many such other devices can only effectively suppress certain types of arc events or only arcs created under certain conditions. Other devices may have more effective arc suppression characteristics, but are usually plagued with complex electronic circuits and devices, which may be expensive to produce and/or prone to failure.

Consequently, a need exists for a method and apparatus for preventing and/or suppressing arc events in plasma processes and under various operating conditions. Such a method and apparatus should allow for the effective suppression of arcs under a wide range of conditions, but without the need to resort to expensive or complex circuit elements. Additional advantages could be realized if such a device could be used in conjunction with conventional power supplies.

SUMMARY OF THE INVENTION

A circuit for producing an alternating output current may comprise a first current regulator and a second current regulator. The first current regulator produces a first phase of the alternating output current and regulates the current of the first phase. The second current regulator produces a second phase of the alternating output current and regulates the current of the second phase. A control system operatively associated with the first and second current regulators controls the operation of the first and second current regulators.

In another embodiment, a circuit for producing an alternating output current may comprise a first current regulator and a second current regulator. The first current regulator produces a first phase of the alternating output current and regulates the current of the first phase. The second current regulator produces a second phase of the alternating output current and regulates the current of the second phase. A first polarity reversing circuit operatively associated with the first current regulator periodically reverses the polarity of the first phase. A second polarity reversing circuit operatively associated with the second current regulator periodically reverses the polarity of the second phase. A control system operatively associated with the first and second current regulators and the first and second polarity reversing circuits controls the operation of the first and second current regulators and the first and second polarity reversing circuits.

A method for producing an alternating current output having a first phase and a second phase, each of which includes a plurality of polarity reversal pulses, may comprise the steps of: providing first and second current regulators for producing the first and second phases and for regulating the current of the first and second phases; providing first and second polarity reversing circuits for periodically reversing the polarity of the first and second phases and a second polarity reversing circuit for periodically reversing the polarity of the second phase; alternately switching the first and second current regulators between an enabled state and a disabled state so that when the first current regulator is in the enabled state the second current regulator is in the disabled state and vice-versa; activating the first polarity reversing circuit and deactivating the second polarity reversing circuit when the first current regulator is in the enabled state and the second current regulator is in the disabled state; and deactivating the first polarity reversing circuit and activating the second polarity reversing circuit when the first current regulator is in the disabled state and the second current regulator is in the enabled state.

BRIEF DESCRIPTION OF THE DRAWINGS

Illustrative and presently preferred embodiments of the invention are shown in the accompanying drawings in which:

FIG. 8(a) is a graphical representation of the first switch control signal that is used to control the first switching device;

FIG. 8(b) is a graphical representation of the second switch control signal that is used to control the second switching device;

FIG. 8(c) is a graphical representation of the third switch control signal that is used to control the third switching device;

FIG. 8(d) is a graphical representation of the fourth switch control signal that is used to control the fourth switching device;

FIG. 8(e) is a graphical representation of the fifth switch control signal that is used to control the fifth switching device;

FIG. 8(f) is a graphical representation of the sixth switch control signal that is used to control the sixth switching device;

FIG. 8(g) is a graphical representation of the output voltage across the first and second output terminals; and FIG. 8(h) is a graphical representation of the output voltage across the third and fourth output terminals.

DETAILED DESCRIPTION OF THE INVENTION

Figure 1:
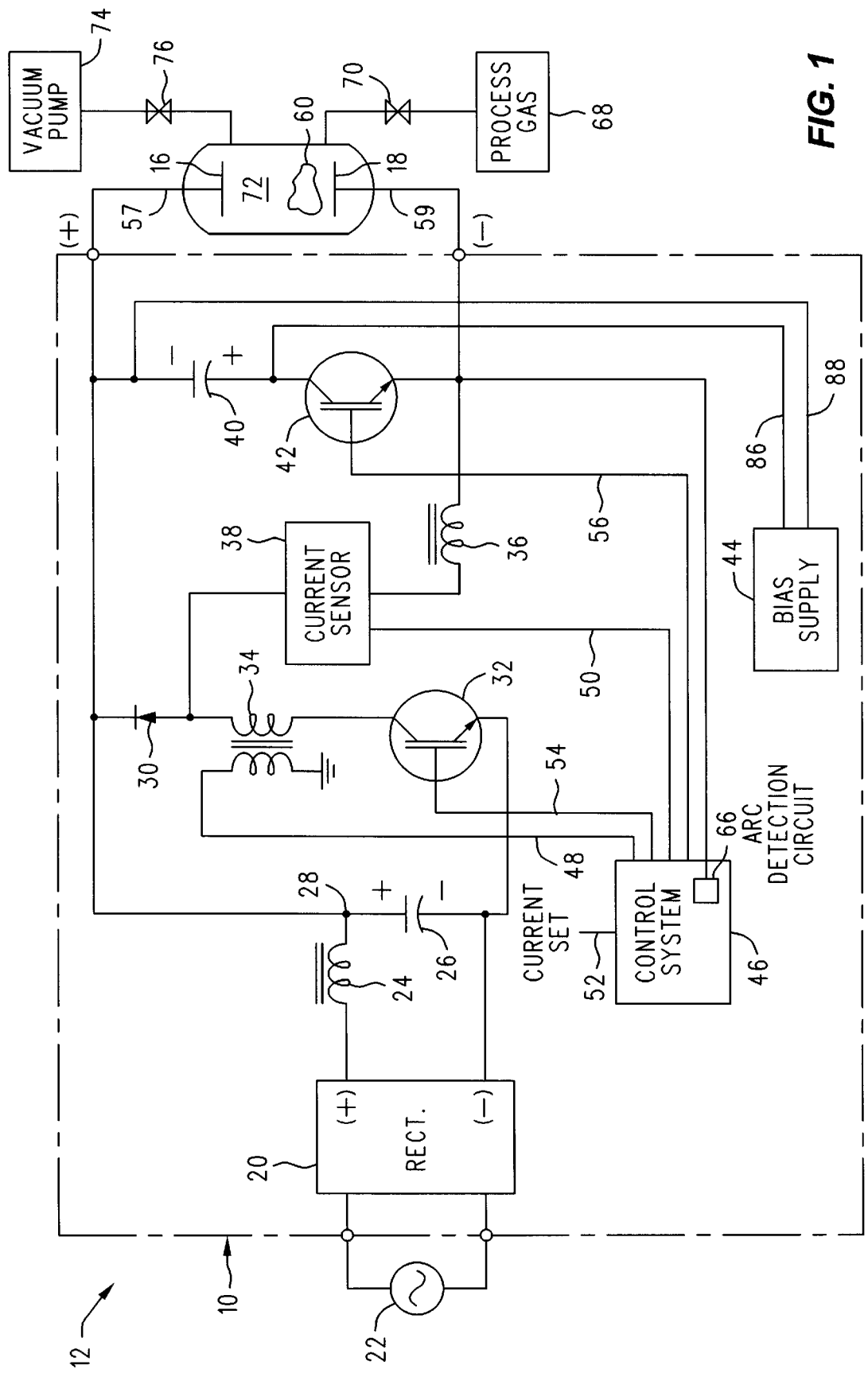
FIG. 1 is a schematic representation of a first embodiment of a combined regulator and pulsing circuit according to the present invention.

A power supply having a combined regulator and pulsing circuit 10 according to one preferred embodiment of the present invention is shown in FIG. 1 as it could be utilized in a plasma processing system 12 of the type that may be used to perform any of a wide variety of plasma processes. For example, in the embodiments shown and described herein, the plasma processing system 12 is used to perform sputter deposition to deposit a thin film or coating (not shown) on the surface of a substrate (also not shown) contained within a process chamber 14. The power supply having a combined regulator and pulsing circuit 10 provides power to the plasma processing system 12 in the form of a DC output signal 64 (FIG. 2c) that is placed across a first electrode 16 and a second electrode 18 contained within the process chamber 18. In one preferred embodiment, the first electrode 16 is connected to the positive (+) output terminal of the combined regulator/pulsing circuit 10, thus serves as the anode. The second electrode 18 is connected to the negative (−) output terminal, thus serves as the cathode.

The power supply having a combined regulator and pulsing circuit 10 includes a rectifier circuit 20 which may be connected to a suitable external power source, such as an alternating current source 22. The rectifier circuit 20 converts alternating current produced by the alternating current source 22 into a direct current suitable for use by the combined regulator and pulsing circuit 10. A first inductor 24 and a first capacitor 26 are connected in series across the positive (+) and negative (−) output terminals of the rectifier circuit 20. The positive (+) output terminal of the combined regulator/pulsing circuit 10 is connected to the node 28 between the first inductor 24 and the first capacitor 26. The positive (+) output terminal of the combined regulator/pulsing circuit 10 may then be electrically connected to the first electrode 16 by any convenient conductor, such as a wire 57. A diode 30 and a first switching device 32 are connected in series across the first capacitor 26. A current sensing device, such as a transformer 34, may be connected in series between the diode 30 and first switching device 32, as will be described in greater detail below.

A second inductor 36 is connected in series between the anode of diode 30 and the negative (−) output terminal of the combined regulator/pulsing circuit 10. The negative (−) output terminal of the combined regulator/pulsing circuit 10 may then be connected to the second electrode 18 by any convenient conductor, such as wire 59. An optional current sensor 38 may be connected in series between the anode of diode 30 and the second inductor 36. A second capacitor 40 and a second switching device 42 are connected in series across the positive (+) and negative (−) output terminals of the combined regulator and pulsing circuit 10.

A bias supply circuit 44 may be connected across the second capacitor 40 to maintain the charge on the second capacitor 40 within a predetermined range. A control system 46 connected to the first and second switching devices 32 and 42, respectively, switches each switching device 32, 42 between a conducting and a non-conducting state in response to current feedback signals 48 and 50 produced by the respective current sensing devices 34 and 38 and in response to a current set signal 52.

As will be explained in greater detail below, the first switching device 32 performs the regulation function (i.e., regulates the current output of the combined regulator and pulsing circuit 10), whereas the second switching device 42 provides the pulsing function (i.e., provides the polarity reversing pulses 58 (FIG. 2c) comprising the DC output signal 64).

Figure 2:
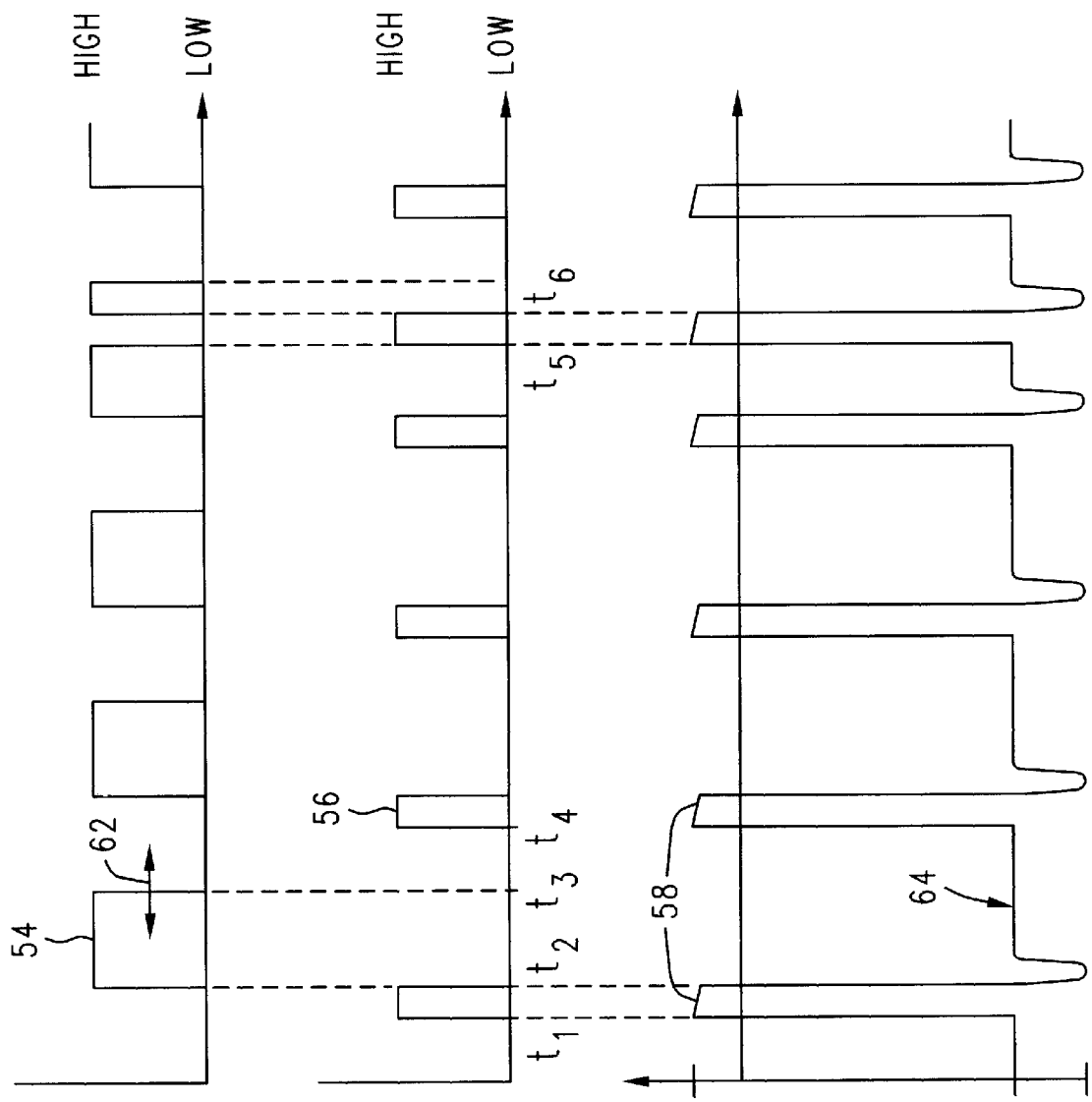
FIG. 2a is a graphical representation of the first switch control signal that is used to control the first switching device.
FIG. 2b is a graphical representation of the second switch control signal that is used to control the second switching device.
FIG. 2c is a graphical representation of a typical DC output signal that is placed on the cathode.

Referring now to FIGS. 2a and 2b, the control system 46 produces a first switch actuation signal 54 and a second switch actuation signal 56. The first and second switch actuation signals 54 and 56 are used to operate the first and second switching devices 32 and 42, respectively. The first switch actuation signal 54 may comprise a pulse width modulated (PWM) signal that may be in either a "high" state or a "low" state. When in the "high" state, the first switch actuation signal 54 places the first switching device 32 in the conducting or closed state. Conversely, when in the "low" state, the first switching device 32 is placed in the non-conducting or open state. The width 62 of the pulse width modulated (PWM) signal 54 is used to control the current output of the combined regulator/pulsing circuit 10. The second switch actuation signal 56 comprises a signal having a constant pulse width that may be in either the "high" or "low" states. When the second switch actuation signal 56 is in the "high" state, the second switching device 42 is placed in the conducting or closed state. When in the "low" state, the second switch actuation signal 56 switches the second switching device 42 to the non-conducting or open state.

The power supply having a combined regulator and pulsing circuit 10 may be operated in one of two modes depending on the desired performance of the circuit. In the first mode, referred to herein as the "passive arc suppression mode," the combined regulator/pulsing circuit 10 is operated in such a manner that the control system 46 periodically closes the second switching device 42 to reverse the polarity on the electrodes 16, 18. That is, the control system 46 causes the power supply having the combined regulator and pulsing circuit 10 to produce the polarity reversing pulses 58 (FIG. 2c) on DC output signal 64. This periodic reversing of the polarity on the electrodes 16, 18 tends to remove any space charge that may have accumulated on the electrodes 16, 18, thereby effectively preventing the development of conditions likely to lead to arcing. In most processing modes, such a periodic voltage polarity reversal will be sufficient to prevent the occurrence of arcs. However, in the event more robust arc suppression is desired or required, the control system 46 may be provided with an optional arc detection circuit 66.

When provided with the arc detection circuit 66, the combined regulator/pulsing circuit 10 may be operated in an "active arc suppression mode" in which the second switching device 42 is actuated whenever an arc condition is detected. As explained above, the actuation of the second switching device 42 produces a polarity reversing pulse 58 (FIG. 2c) which has the effect of almost immediately reversing the voltage potential on the electrodes 16 and 18, thus quenching the arc before it has a chance to fully develop and adversely affect the coating process.

The operation of the power supply having the combined regulator and pulsing circuit 10 in the passive arc suppression mode is best understood by referring to FIGS. 1 and 2a–2c. In order to accomplish the desired plasma deposition process (e.g., sputter deposition), the voltage on the second electrode 18 (i.e., the cathode) is maintained at a negative potential (e.g., −500 volts (V)) with respect to the first electrode 16 (i.e., the anode). This condition exists when the second switching device 42 is in the non-conducting state (i.e., when the second switch actuation signal 56 is "low"). The first switch actuation signal 54 may be in either the "high" or "low" states, as will be described in greater detail below. During this time, the process occurring within chamber 14 is more or less operating in a steady state, with a substantially constant current flowing through the plasma 60. During this operating state the second capacitor 40 will have a net reverse charge (indicated by the "+" and "−" signs) across its plates with respect to the polarity of the electrodes 16 and 18. The first capacitor 26 will essentially have the relative charge in the sense also indicated by the (+) and (−) signs shown in FIG. 1.

At a certain time $t_1$ (FIG. 2b), the second switch actuation signal 56 goes "high," which switches the second switching device 42 from the non-conducting (i.e., open) state to the conducting (i.e., closed) state. The second capacitor 40 will now be connected directly across the first and second electrodes 16 and 18, creating the polarity reversing pulse 58 and essentially instantly reversing the charge on the electrodes 16 and 18. That is, the charge on the second electrode 18 will now be essentially 100 volts (V) positive with respect to the charge on the first electrode 16. See FIG. 2c. This 100 volt potential is impressed across the second inductor 36, causing the current flowing through the second inductor 36 to increase in a substantially linear fashion.

Next, at a time $t_2$, the control circuit 46 causes the second switch actuation signal 56 to go "low" which returns the second switching device 42 to the non-conducting (i.e., open) state. At this point, the increased current flowing through the second inductor 36 causes the voltage on the second electrode 18 to more or less instantly swing negative with respect to the first electrode 16. However, instead of stopping at the previous potential of about −500 V, the increased current flowing through the second inductor 36 and the increased initial impedance of the non-conducting plasma 60 causes the voltage on the second electrode 18 to continue to go negative. Then, as the plasma 60 begins to conduct, the voltage on the second electrode 18 increases until it again reaches about −500 volts with respect to the first electrode 16 and the current through the second inductor 36 decays to its original value. The second switching device 42 remains in the non-conducting (i.e., open) state until a time $t_4$, when it is again switched to the conducting (i.e., closed) state and the cycle repeated, as described above.

At the same time the second switch actuation signal 56 goes "low" i.e., at time $t_2$, the control system 46 places the first switch actuation signal 54 in the "high" state. This causes the first switching device 32 to switch to the conducting state, diverting current from the diode 30 to switching device 32, i.e., switching device 32 provides a current path for current in the second inductor 36 to return to the negative (−) terminal of the rectifier circuit 20. As was mentioned above, the first switch actuation signal 54 comprises a pulse width modulated (PWM) signal wherein the width of the pulse (indicated by arrow 62) can be varied as necessary to control the current output of the power supply having the combined regulator and pulsing circuit 10. In one preferred embodiment, longer pulse widths 62 correspond to higher currents and vice-versa. However, even with the longest pulse width 62, the control system 46 always returns the first switch actuation signal 54 to the "low" state (i.e., at a time $t_3$) before or at the same time as the second switch actuation signal 56 goes "high" (i.e., at time $t_4$).

The first and second switch actuation signals are synchronized so that the first switch actuation signal 54 cannot go "high" until the second switch actuation signal 56 goes "low." Put in other words, the first switch actuation signal 54 is "slaved" to the second switch actuation signal 56 such that the first switch actuation signal 54 goes "high" at the same instant the second switch actuation signal 56 goes "low."

The power supply having a combined regulator and pulsing circuit 10 may be operated as follows to accomplish sputter deposition with the plasma processing system 12. When the combined regulator/pulsing circuit 10 is first turned on or activated, the control system 46 produces the first and second switch control signals 54 and 56 which control the operation of the first and second switching devices 32 and 42 in the manner described above. This results in a DC output signal 64 (FIG. 2c) being placed across the first and second electrodes 16, 18. The control circuit 46 varies the pulse width 62 of the first switching device actuation signal 54 as necessary to maintain the output current of the combined regulator/pulsing circuit 10 within a predetermined range, as determined by the current set signal 52. Current set signal 52 may be programmed in advance by the user and corresponds to a desired output current limit or range.

Each time the control system 46 switches the second switching device 42 to the conductive state (i.e., when the second switch actuation signal 56 goes "high"), the combined regulator/pulsing circuit 10 produces a polarity reversing pulse 58 which quickly reverses the polarity on the electrodes 16, 18 to reduce or eliminate arcing within the chamber 14. In one preferred embodiment, the polarity reversing pulses 58 occur periodically at intervals of about 0.05 milliseconds (ms), which is generally sufficient to reduce or eliminate entirely arcing. However, in the event more robust arc suppression is desired, the control system 46 may be provided with an arc detection circuit 66. Briefly, the arc detection circuit 66 detects the existence of an arc condition within the chamber 14 and instructs the control system 46 to make the first switch actuation signal 54 go "low" and the second switch actuation signal 56 go "high" (e.g., at a time $t_5$ in FIG. 2b). This high second switch actuation signal 56 switches the second switching device 42 to the conducting state which reverses the polarity on the electrodes 16 and 18 in the manner already described. Then, a short time later (e.g., 0.004 milliseconds (ms)) at a time $t_6$ the first switch actuation signal 54 again goes "high" and the second switch actuation signal 56 again goes "low." This returns the first switching device 32 to the conducting or closed state and the second switching device 42 to the non-conducting or open state.

A significant advantage associated with the power supply having a combined regulator and pulsing circuit 10 according to the present invention is that it is capable of quickly reversing the polarity across the first and second electrodes to discourage the formation of an arc condition within the process chamber 14. Another advantage of the present invention is that it contains a minimum number of energy storing circuit elements, which generally enhances operation and allows for fast response.

Having briefly described the power supply having the combined regulator and pulsing circuit 10, as well as some of its more significant features and advantages, the combined regulator/pulsing circuit 10, as well as the associated plasma processing system 12 that may be used with the combined regulator/pulsing circuit 10, will now be described in detail. However, before proceeding with the description of the various embodiments of the present invention, it should be noted that the various circuits are shown and described herein in simplified form for clarity and ease of understanding the present invention. That is, the various embodiments of the power supplies do not include systems, circuits, and elements that are not directly related to the operation of the present invention, but that may be required or desired in a particular application. For example, most power supplies utilized in plasma deposition processes include one or more control systems and feedback loops to regulation the operation of the power supplies and to allow them to be operated in several different modes, such as constant current or constant power modes. While some feedback and control circuits are shown and described herein since they pertain to the present invention, certain other control circuits and feedback systems are not shown and described herein. However, such systems and circuits could be easily provided by persons having ordinary skill in the art after having become familiar with the present invention.

Referring back now to FIG. 1, the power supply having the combined regulator and pulsing circuit 10 is shown as it may be used with a plasma processing system 12 of the type that may be used to accomplish various plasma processes. For example, in one preferred embodiment, the plasma processing system 12 may comprise a non-reactive sputter deposition system that may be used to deposit a thin film or coating (not shown) onto the surface of an object or substrate (also not shown) positioned within the process chamber 14. Alternatively, however, the combined regulator/pulsing circuit 10 and plasma processing system 12 could be used to accomplish other types of plasma processes, such as reactive sputter deposition or sputter etching. Therefore, the present invention should not be regarded as limited to the non-reactive sputter deposition process that is shown and described herein.

The power supply having the combined regulator and pulsing circuit 10 generates a DC output voltage signal 64 (FIG. 2c) that is placed across the first and second electrodes 16 and 18. The DC output voltage signal 64 produces an electric field (not shown) between the first and second electrodes 16 and 18 positioned within the process or vacuum chamber 14. The first electrode 16 is connected to the positive (+) output terminal of the combined regulator/pulsing circuit 10, thus serves as the anode. The first electrode or anode 16 may comprise any of a wide range of separate anode members. Alternatively, the anode or first electrode 16 may comprise the process chamber 14 itself. The second electrode 18 is connected to the negative (−) output terminal of the combined regulator/pulsing circuit 10, thus serves as the cathode. Accordingly, the second electrode 18 may comprise a cathode/target assembly (not shown) which contains the material (commonly referred to as the target) that is to be deposited on the surface of the object or substrate (also not shown). The cathode/target assembly utilized in one preferred embodiment of the present invention may comprise a planar magnetron cathode/target assembly of the type shown and described in U.S. Pat. No. 5,262,028 which is incorporated herein by reference for all that it discloses. Alternatively, other types of cathode/target assemblies, such as non-planar magnetrons or even regular (i.e., non-magnetron) diode sources could also be used. Therefore, the present invention should not be regarded as limited to any particular type of cathode/target assembly.

In accordance with its use to accomplish non-reactive sputter deposition processes, the process chamber 14 may include a process gas supply 68 which contains a supply of a suitable process gas (not shown), such as argon, although other gases could also be used. A process gas valve 70 connected between the process gas supply 68 and the process chamber 14 may be used to regulate the flow of process gas into the interior 72 of chamber 14. The process chamber 14 may also include a vacuum pump assembly 74 and a vacuum valve assembly 76 to maintain the interior 72 of the process chamber 14 within a range of pressures suitable for carrying out the desired process. For example, in most magnetron sputter deposition processes it is usually desirable to maintain the interior 72 of the process chamber 14 at a pressure of about 1 milliTorr (mTorr), although other pressures could also be used depending on the nature of the material being deposited and on other extrinsic factors.

It should be noted that process chambers (e.g., process chamber 14), as well as the various ancillary devices and systems (e.g., process gas supply systems, vacuum pumping systems, etc.) associated therewith, are well-known in the art and could be easily provided by persons having ordinary skill in the art after having become familiar with the present invention. Therefore, the particular process chamber 14 and related ancillary systems and devices utilized in one preferred embodiment of the invention will not be described in further detail.

If it is desired to configure the plasma processing system 12 to accomplish reactive sputter deposition, then the process chamber 14 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 72 of process chamber 14. However, since such additional systems and devices required to accomplish reactive sputter deposition processes are also well-known in the art and could be easily provided by persons having ordinary skill in the art after having become familiar with the present invention, the additional systems and devices that may be required or desired to accomplish reactive sputter deposition also will not be described in further detail herein.

Still referring to FIG. 1, a power supply having the combined regulator and pulsing circuit 10 places a DC output signal 64 (FIG. 2c) across the first and second electrodes 16 and 18. The DC output signal 64 comprises a plurality of polarity reversing pulses 58 that are generated each time the second switching device 42 is placed in the conducting state. As will be described in greater detail below, this may occur on a periodic basis (when operating in the passive arc suppression mode). Alternatively, a polarity reversing pulse 58 may be produced when an arc condition is detected in the chamber 14 (when operating in the active arc suppression mode).

The power for the combined regulator and pulsing circuit 10 may be derived from a rectifier circuit 20 which converts alternating current (AC) produced by an alternating current source 22 to a direct current (DC) suitable for use by the combined regulator/pulsing circuit 10. Alternatively, any convenient supply of direct current could also be used to provide power to the combined regulator/pulsing circuit 10. In one preferred embodiment, the alternating current source 22 may comprise a conventional 240 volt, 3 phase, 60 Hz alternating current supply in which case the rectifier circuit 20 may comprise a conventional 3-phase rectifier circuit to convert the 3-phase AC into DC. If desired, the AC produced by the alternating current source 22 could be isolated from the power supply by placing a conventional wye-delta (Y-Δ) transformer between the alternating current source 22 and the rectifier circuit 20. However, since such isolation transformers are well-known, the transformer used in one preferred embodiment will not be described in further detail.

Alternatively, the alternating current source 22 may comprise a single phase supply in which case the rectifier circuit 20 would comprise a single phase rectifier circuit to convert the single phase alternating current into DC. In any event, since rectifier circuits for converting 3-phase or single phase alternating current into direct current are well known, the rectifier circuit 20 utilized in one preferred embodiment will not be described in further detail herein.

A first inductor 24 and a first capacitor 26 are connected in series across the positive (+) and negative (−) terminals of the rectifier circuit 20. The first inductor 24 and first capacitor 26 add inductive and capacitive reactance to the circuit and help dampen the power fluctuations resulting from the operation of the first and second switching devices 32 and 42. Accordingly, the first inductor 24 and the first capacitor 26 may comprise any of a wide range of values depending on the design voltage and power levels of the particular combined regulator/pulsing circuit 10, as well as on other extrinsic considerations. Thus, the present invention should not be regarded as limited to any particular values or ranges of values for the first inductor 24 and capacitor 26. By way of example, in one preferred embodiment the first inductor 24 may have an inductance in the range of about 0.2 millihenries (mH) to 10 mH (0.6 mH preferred), and the first capacitor 26 may have a capacitance in the range of about 1,000 microfarads ($\mu$F) to 100,000 $\mu$F (10,000 $\mu$F preferred).

The diode 30 and the first switching device 32 are connected in series across the first capacitor 26. It is preferred, but not required, that a transformer 34 be connected in series between the diode 30 and first switching device 32. Transformer 34 provides a current feedback signal 48 to the control system 46 that is related to the current flowing through the first switching device 32. Alternatively, other types of current sensing devices (not shown) could also be used. The first switching device 32 is connected to the control system 46 and is responsive to the first switch actuation signal 54 which switches the first switching device between a conducting or closed state and a non-conducting or open state. More specifically, when the first switch actuation signal 54 is in the "low" state (FIG. 2a), the first switching device is in the non-conducting or open state. Conversely, when the first switch actuation signal 54 is in the "high" state, the first switching device is in the conducting or closed state.

The diode 30, first switching device 32, and transformer 34 may comprise any of a wide range of components depending on the particular application and voltages and currents at which the power supply is to be operated. In one preferred embodiment, the diode 30 may comprise a diode rated at 1,000 volts (V) and 100 amperes (A), such as type APT2X101D100J available from Advanced Power Technology, Inc., of Bend, Oreg. The first switching device 32 comprises an insulated gate bi-polar transistor (IGBT), such as type 1MBI300L-120 available from Collmer Semiconductors of Dallas, Tex. Alternatively, other types of switching devices, such as metal oxide field effect transistors (MOSFETs) could also be used. Transformer 34 may comprise a current transformer having a turns ratio of about 200:1, such as type D1871 available from Coil Craft of Cary, Ill., although other types of transformers or current sensing devices could also be used.

A second inductor 36 is connected between the anode of diode 30 and the negative (−) output terminal of the combined regulator/pulsing circuit 10. An optional current sensor 38 may be connected in series between the anode of diode 30 and the second inductor 36. Current sensor 38 produces a current feedback signal 50 that is directed to the control system 46. In one preferred embodiment, the second inductor 36 has an inductance of 200 microhenries ($\mu$H), although other inductances could be used, again depending on the particular circuit, application, and other extrinsic factors. The current sensor 38 may comprise a model no. LA-205S available from LEM USA, Inc., of Milwaukee, Wis.

A second capacitor 40 and second switching device 42 are connected in series across the positive (+) and negative (−) output terminals of the combined regulator/pulsing circuit 10. The second switching device 42 is connected to the control system 46 and is responsive to the second switch actuation signal 56 (FIG. 2b). When the second switch actuation signal 56 is in the "low" state, the second switching device 42 is in the non-conducting or open state. Conversely, when the second switch actuation signal 56 is in the "high" state, the second switching device is in the conducting or closed state. As was the case for the other components comprising the combined regulator/pulsing circuit 10, the values and types of the second capacitor 40 and second switching device 42 may comprise any of a wide range of values and types depending on the particular circuit, intended application, and other extrinsic factors. Consequently, the present invention should not be regarded as limited to a second capacitor 40 and second switching device 42 having any particular type or value. By way of example, in one preferred embodiment, the first capacitor 40 has a capacitance in the range of 10 microfarads ($\mu$F) to 1,000 $\mu$F (100 $\mu$F preferred). The second switching device may comprise an IGBT, such as type 1MBI300L-120 available from Collmer Semiconductors of Dallas, Tex. Alternatively, other types of switching devices, such as MOSFETs could also be used.

The control system 46 may comprise a pulse generator or a combination of pulse generators suitable for generating the first and second switch actuation signals 54 and 56 based on the various current feedback signals 48 and 50 and based on the current set signal 52. In one preferred embodiment, the current set signal may be produced by a current set circuit (not shown) based on user selected input for a desired current operation level.

The first switch actuation signal 54 produced by the control system comprises a pulse width modulated (PWM) signal. Since the first switching device 32 is placed in the conducting state when the PWM signal 54 is in the "high" state, longer pulse widths 62 will correspond to higher output currents. Conversely, shorter pulse widths 62 correspond to lower output currents. The PWM signal 54 is synchronized with, or slaved to, the second switch actuation signal 56, so that the first switch actuation signal 54 can only go in the "high" state when the second signal 56 goes "low." This condition is illustrated in FIGS. 2a and 2b.

The synchronization of the first switch actuation signal 54 with the second switch actuation signal 56 in the manner described above is important in achieving the objects and advantages of the present invention. That is, if the first signal 54 is not slaved to the second signal 56, but could instead go "high" at any time, then the second inductor 36 could become saturated unless it is provided with a much greater inductance that is required by the circuit of the present invention.

As was mentioned above, the control system 46 may comprise any of a wide range of circuits (e.g., pulse generators) suitable for generating the first and second switch actuation signals 54 and 56 according to the requirements set forth above. Consequently, the present invention should not be regarded as limited to any particular control system or control system configuration. By way of example, in one preferred embodiment, the control system 46 may comprise a model no. UC3825 pulse generator circuit available from Unitrode Integrated Circuits Corp. of Merrimack, N.H.

A bias supply circuit 44 is connected across the second capacitor 40 by a pair of wires 86, 88. The bias supply circuit 44 maintains the charge on the second capacitor 40, thus compensates for the depletion of energy in the second inductor 36 and the second capacitor 40. In one preferred embodiment, the bias supply circuit 44 may comprise a relatively simple regulated power supply to maintain the charge across the second capacitor 40 within a predetermined range such as, for example, between about 30 to 150 volts. However, since regulated power supplies of the type that may be used to maintain the voltage across the second capacitor 40 within the predetermined range are well-known and could be easily provided by persons having ordinary skill in the art after having become familiar with the teachings of the present invention, the particular bias supply circuit 44 utilized in one preferred embodiment of the invention will not be described in further detail herein.

Figure 3:
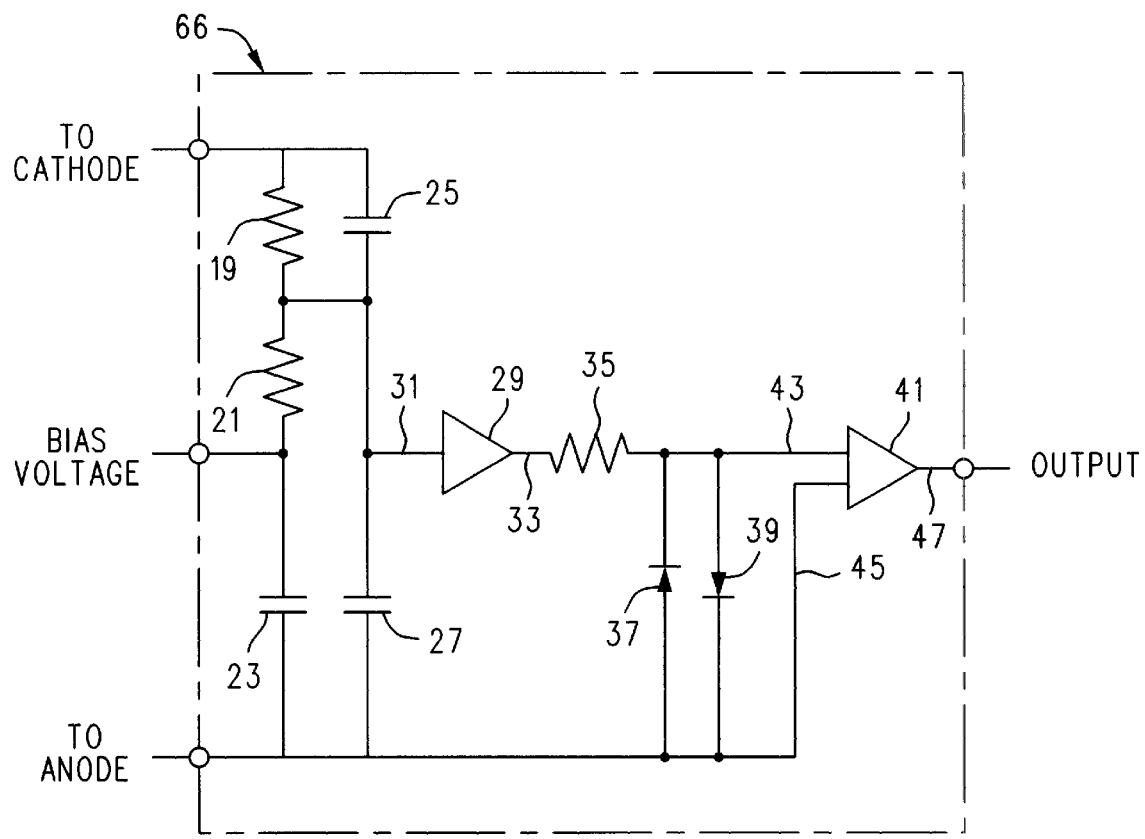
FIG. 3 is a schematic representation of the arc detection circuit shown in FIG. 1.

In certain circumstances, it may be advantageous to enhance the arc suppression capabilities of the combined regulator/pulsing circuit 10 described above by providing the control system 46 with an arc detection circuit 66. The arc detection circuit 66 works in concert with the normal operation of the control system 46 to reverse the voltage potential on the first and second electrodes 16 and 18 if an arc condition is detected during the time when the second switching device 42 is in the non-conducting (i.e., open) state (e.g., during the time between two successive polarity reversing pulses 58). While many different kinds of arc detection devices are known and may be used with the present invention, one preferred embodiment of the present invention uses an arc detection circuit 66 substantially as shown in FIG. 3.

Essentially, arc detection circuit 66 may comprise first and second resistors 19 and 21 connected in series with a first capacitor 23 across the anode and cathode (i.e., the first and second electrodes 16 and 18). See FIG. 1. A second capacitor 25 is connected in parallel with the first resistor 19. A third capacitor 27 is connected in series with the second capacitor 25 so that it is also connected in parallel with the series arrangement of resistor 21 and capacitor 23. The combination of resistors 19, 21 and capacitors 25 and 27 form a compensated voltage divider network which provides to the buffer amplifier 29 a reduced-voltage signal 31 that more accurately represents the actual voltage signal (i.e., waveform) on the cathode and anode, than is possible with conventional, purely resistive voltage divider networks. A bias voltage is applied to resistor 21 to define the voltage level at which an arc is to be recognized. That is, an arc condition is assumed to exist and is recognized by the arc detection circuit 66 if the voltage potential between the electrodes starts to decrease and passes through a defined voltage level. The defined voltage level can be varied by adjusting the magnitude of the bias voltage applied to resistor 21.

The reduced voltage signal 31 from the compensated voltage divider network is then fed into buffer amplifier 29. The output signal 33 from buffer amplifier 29 is fed via resistor 35 to a diode clamp circuit comprising diodes 37 and 39. Under normal circumstances, the output signal 33 from buffer amplifier 29 will be negative. Hence, current will flow via resistor 35 and diode 37 and a negative clamped voltage of about 0.6 volts will appear across the input leads 43, 45 of comparator 41. Conversely, if the output signal 33 from amplifier 29 goes positive, diode 39 will conduct, again imposing a clamped voltage of about 0.6 volts across input leads 43 and 45 of comparator 41. The arrangement of diodes 37 and 39, along with resistor 35, forms a non-linear voltage divider network which substantially reduces the input impedance presented to the input of comparator 41, thus removing a substantial amount of the RF (i.e., radio frequency) noise present in the output signal 47. The comparator 41 produces an output signal 47 when the voltage across its input leads 43, 45 passes through zero. The output signal 47 from comparator 41 may then be used by the control system 46 to trigger the second switching device 42, i.e., place it in the conducting state while placing the second switching device 32 in the non-conducting or open state. It should be noted that in this application it will be desirable to design the arc detection circuit 66 so that it will ignore the low voltage on the cathode if the low voltage occurs during the normal reverse polarity pulse 58, i.e., during normal pulsing.

The operation of the power supply having the combined regulator and pulsing circuit 10 is best understood by referring to FIGS. 1 and 2a–c simultaneously. When the combined regulator/pulsing circuit 10 is first activated or turned on, the control system 46 begins to generate the first and second switch actuation signals 54 and 56. Ignoring for the moment the effect of the second switch actuation signal 56, when the first switch actuation signal 54 goes "high" the first switching device 32 is switched to the conducting state. This allows current to flow from the positive (+) terminal of the rectifier circuit, through the first inductor 24, plasma 60 (the plasma 60 is created by the electric field (not shown) developed across the first and second electrodes 16 and 18), second inductor 36, current sensor 38, transformer 34, and the first switching device 32. The current then returns to the negative (−) terminal of the rectifier circuit 20.

When the first switching device 32 is placed in the non-conducting state (i.e., when the control system 46 causes the first switch actuation signal 54 to switch to the "low" state), current continues to flow in the inductor 36 and plasma 60, but this time through diode 30. The current gradually diminishes as the energy stored in the second inductor 36 is depleted. The time averaged output current of the combined regulator/pulsing circuit 10 can thus be controlled by varying the "on" time of the first switching device 32 (i.e., by varying the pulse width 62 of first switch actuation signal 54). See FIG. 2a. The desired width 62 of pulse 54 is controlled by the control system 46 based on the current feedback signal 50 produced by the current sensor 38. The current feedback signal 48 produced by the transformer 34 is used to turn-off the first switching device 32 in the event the current flow through the switching device 32 exceeds the maximum safe current that can be handled by the switch 32.

Considering now the effects of the second switch actuation signal 56, recall that the second switch actuation signal 56 results in the creation of the polarity reversing pulse 58 (FIG. 2c). In all operating conditions, the first switch 32 will be in the non-conducting or open state immediately before (or at the same time as) the second switch actuation signal 56 goes "high." In this condition, current will be flowing through the second inductor 36, current sensor 38, diode 30 and plasma 60. Now, when the second switching device 42 is switched to the conducting or closed state, the capacitor 40 will be connected across the first and second electrodes 16 and 18. Since the second capacitor 40 has a net reverse charge (as indicated by the "+" and "−" signs) with respect to the charge that was on the electrodes 16 and 18, the polarity on the electrodes will be substantially instantaneously reversed. That is, the voltage on the cathode 18 will swing positive with respect to the voltage on the anode 16. This condition is illustrated by the polarity reversing pulse 58 in FIG. 2c. The capacitor 40 discharges primarily through the inductor 36, which increases the current flowing in the inductor 36.

Next, the second switching device is turned off at the same time the first switching device 32 is turned back on. The first switch then provides a path for the current from the second inductor 36 back to the negative (−) terminal of the rectifier circuit 20. The plasma 60 is then re-ignited and the process in chamber 14 continues. The net reverse charge on the second capacitor 40 is replenished by the bias supply circuit 44 in the manner already described.

In the event the combined regulator/pulsing circuit 10 is provided with an arc detection circuit 66 and is operated in the "active arc suppression mode" the first switching device 32 is placed in the non-conducting or open state while the second switching device 42 is placed in the conducting state whenever an arc condition is detected in the chamber 14. If an arc condition is detected when the first switching device 32 is in the non-conducting state, then the operation of the circuit is exactly as described above, except that the polarity reversing pulse 58 is produced upon the detection of the arc condition. If, however, an arc condition is detected when the first switching device 32 is in the conducting state, the control system 46 simultaneously turns-off the first switching device 32 and turns-on the second switching device 42.

This condition is illustrated in FIGS. 2a–c at times $t_5$ and $t_6$. That is, suppose an arc condition is detected at a time $t_5$. At this time, the first switch actuation signal 54 is "high" and the second switch actuation signal 56 is "low" (i.e., the first switching device 32 is conducting and the second switching device is non-conducting). The control system 46 causes the first switch actuation signal 54 to go "low" at the same time the second switch actuation signal 56 goes "high," thereby turning off the first switching device 32 and turning on the second switching device 42. This circuit configuration results in the creation of a polarity reversing pulse 58 which removes the arc condition. Then, at a time $t_6$, the control system turns off the second switching device 42 and turns back on the first switching device 32.

Figure 4:
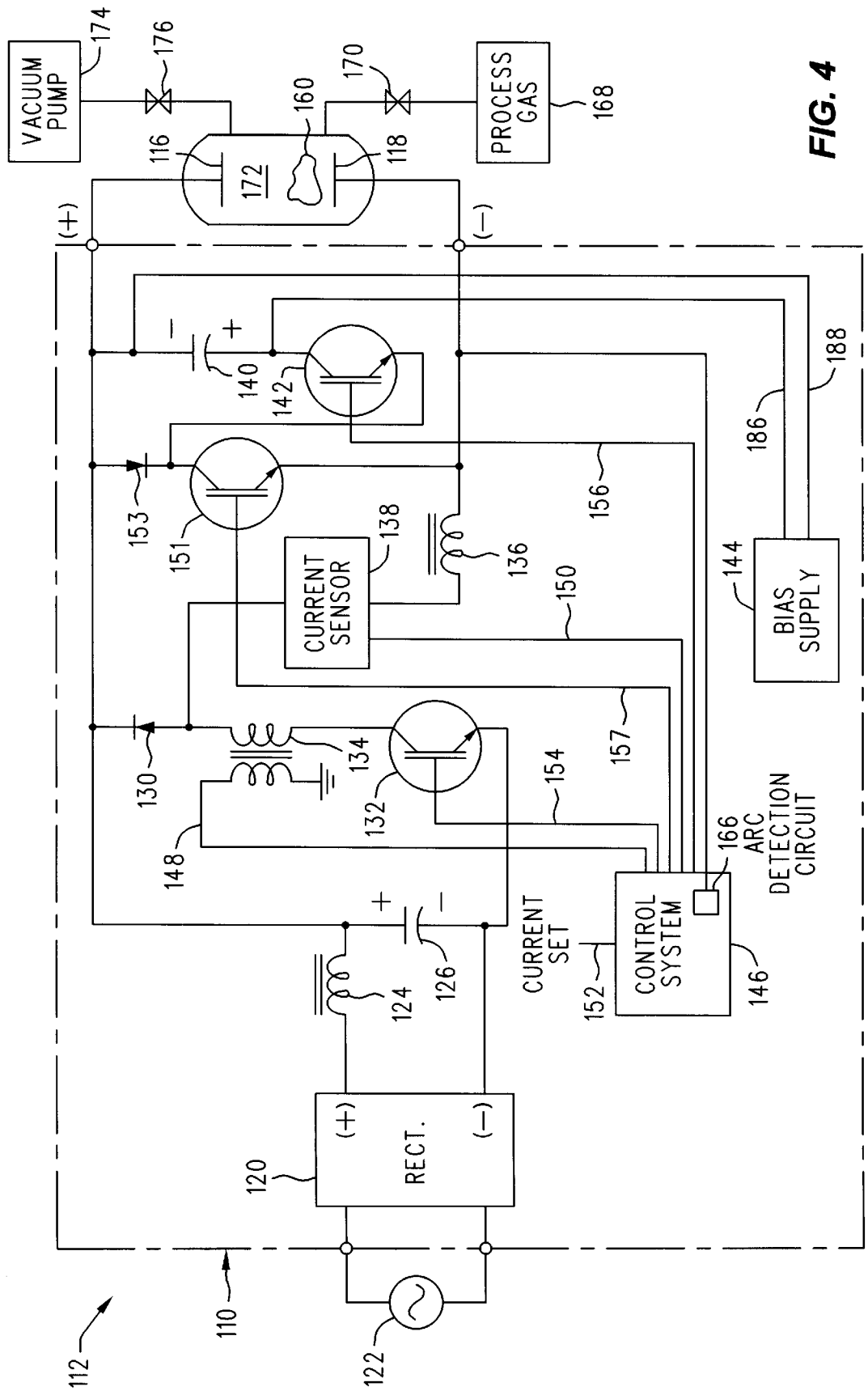
FIG. 4 is a schematic representation of a second embodiment of a combined regulator and pulsing circuit according to the present invention.
Figure 5:
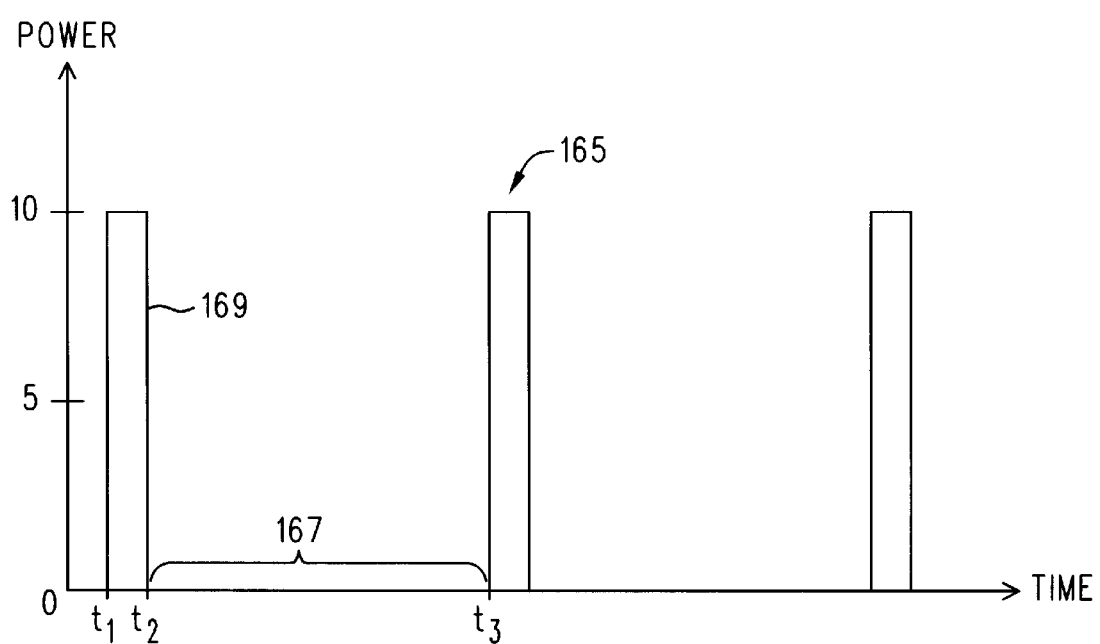
FIG. 5 is a graphical representation showing the power delivered to the electrodes of the process chamber by the second embodiment of the combined regulator and pulsing circuit shown in FIG. 4.

A second embodiment 110 of the power supply having a combined regulator and pulsing circuit is shown in FIG. 4. This second embodiment 110 is capable of producing a power output signal 165 substantially as shown in FIG. 5. The power output signal 165 allows the process within chamber 114 to be operated at high power levels for short periods of time (e.g., between $t_1$ and $t_2$), followed by a quiescent state 167 (e.g., between $t_2$ and $t_3$) wherein substantially no power is delivered to the process chamber 114.

Referring now primarily to FIG. 4, the second embodiment 110 of a power supply having a combined regulator and pulsing circuit is shown as it may be used with a plasma processing system 112 of the type that may be used to accomplish various plasma processes. For example, the plasma processing system 112 may comprise a non-reactive sputter deposition system that may be used to deposit a thin film or coating (not shown) onto the surface of an object or substrate (also not shown) positioned within the process chamber 114. Alternatively, however, the power supply 110 and plasma processing system 112 could be used to accomplish other types of plasma processes, such as reactive sputter deposition or sputter etching.

The power supply having the combined regulator and pulsing circuit 110 generates a DC output voltage signal that is placed across the first and second electrodes 116 and 118. The DC output voltage signal produces an electric field (not shown) between the first and second electrodes 116 and 118 positioned within the process or vacuum chamber 114. The first electrode 116 is connected to the positive (+) output terminal of the power supply 110, thus serves as the anode. The second electrode 118 is connected to the negative (−) output terminal of the power supply 110, thus serves as the cathode. Accordingly, the second electrode 118 may comprise a planar magnetron cathode/target assembly of the type shown and described in U.S. Pat. No. 5,262,028 which was incorporated by reference above. Alternatively, other types of cathode/target assemblies, such as non-planar magnetrons or even regular (i.e., non-magnetron) diode sources could also be used.

In accordance with its use to accomplish non-reactive sputter deposition processes, the process chamber 114 may include a process gas supply 168 which contains a supply of a suitable process gas (not shown), such as argon, although other gases could also be used. A process gas valve 170 connected between the process gas supply 168 and the process chamber 114 may be used to regulate the flow of process gas into the interior 172 of chamber 114. The process chamber 114 may also include a vacuum pump assembly 174 and a vacuum valve assembly 176 to maintain the interior 172 of the process chamber 114 within a range of pressures suitable for carrying out the desired process.

If it is desired to configure the plasma processing system 112 to accomplish reactive sputter deposition, then the process chamber 114 may also be provided with a reactant gas source (not shown) that contains a supply of a suitable reactant gas. Examples of suitable reactant gases include, but are not limited to, oxygen ($O_2$), nitrogen ($N_2$), and hydrogen sulfide ($H_2S$). The reactant gas source (not shown) may also include a valve assembly (also not shown) to regulate the flow of the reactant gas into the interior 172 of process chamber 114.

The second embodiment 110 of the power supply having a combined regulator and pulsing circuit may comprise a rectifier circuit 120 for converting alternating current produced by an alternating current source 122 to a direct current. As was the case for the first embodiment 10, the alternating current source 122 in one preferred embodiment may comprise a conventional 240 volt, 3 phase, 60 Hz alternating current supply in which case the rectifier circuit 120 may comprise a conventional 3-phase rectifier circuit to convert the 3-phase AC into DC. If desired, the AC produced by the alternating current source 122 could be isolated from the power supply by placing a conventional wye-delta (Y-Δ) transformer between the alternating current source 122 and the rectifier circuit 120. Alternatively, the alternating current source 122 may comprise a single phase supply in which case the rectifier circuit 120 would comprise a single phase rectifier circuit to convert the single phase alternating current into DC. In any event, since rectifier circuits for converting 3-phase or single phase alternating current into direct current are well known, the rectifier circuit 120 utilized in one preferred embodiment will not be described in further detail herein.

A first inductor 124 and a first capacitor 126 are connected in series across the positive (+) and negative (−) terminals of the rectifier circuit 120. The first inductor 124 and first capacitor 126 add inductive and capacitive reactance to the circuit and help dampen the power fluctuations resulting from the operation of the first, second, and third switching devices 132 and 142, and 151. Accordingly, the first inductor 124 and the first capacitor 126 may comprise any of a wide range of values depending on the design voltage and power levels of the particular power supply, as well as on other extrinsic considerations. By way of example, in one preferred embodiment the first inductor 124 may have an inductance in the range of about 0.3 millihenrys (mH) to 10 mH (0.6 mH preferred), and the first capacitor 126 may have a capacitance in the range of about 100 microfarads ($\mu$F) to 100,000 $\mu$F (10,000 $\mu$F preferred).

A first diode 130 and a first switching device 132 are connected in series across the first capacitor 126. A transformer 134 may be connected in series between the first diode 130 and the first switching device 132. Transformer 134 provides a current feedback signal 148 to the control system 146 that is related to the current flowing through the first switching device 132. Alternatively, other types of current sensing devices (not shown) could also be used. The first switching device 132 is connected to the control system 146 and is responsive to a first switch actuation signal 154 which switches the first switching device between a conducting or closed state and a non-conducting or open state.

The first diode 130, first switching device 132, and transformer 134 may comprise any of a wide range of components depending on the particular application and voltages and currents at which the power supply is to be operated. In one preferred embodiment, the first diode 130 may comprise a diode rated at 1,000 volts (V) and 100 amperes (A), such as type APT2X101D100J available from Advanced Power Technology, Inc., of Bend, Oreg. The first switching device 132 comprises an insulated gate bi-polar transistor (IGBT), such as type 1MBI300L-120 available from Collmer Semiconductors of Dallas, Tex. Alternatively, other types of switching devices, such as metal oxide field effect transistors (MOSFETs) could also be used. Transformer 134 may comprise a current transformer having a turns ratio of about 200:1, such as type D1871 available from Coil Craft of Cary, Ill, although other types of transformers or current sensing devices could also be used.

A second inductor 136 is connected between the anode of first diode 130 and the negative (−) output terminal of the combined regulator/pulsing circuit 110. An optional current sensor 138 may be connected in series between the anode of diode 130 and the second inductor 136. Current sensor 138 produces a current feedback signal 150 that is directed to the control system 146. In one preferred embodiment, the second inductor 136 has an inductance of 200 microhenries ($\mu$H), although other inductances could be used, again depending on the particular circuit, application, and other extrinsic factors. The current sensor 138 may comprise a model no. LA205S available from LEM USA, Inc., of Milwaukee, Wis.

A second capacitor 140 and second switching device 142 are connected in series across the positive (+) output terminal of the combined regulator/pulsing circuit 110 and the cathode of a second diode 153. The anode of second diode 153 is connected to the positive (+) output terminal. The second switching device 142 is connected to the control system 146 and is responsive to the second switch actuation signal 156. As was the case for the other components comprising the combined regulator/pulsing circuit 110, the values and types of the second capacitor 140 and second switching device 142 may comprise any of a wide range of values and types depending on the particular circuit, intended application, and other extrinsic factors. By way of example, in one preferred embodiment, the first capacitor 140 has a capacitance in the range of 10 microfarads ($\mu$F) to 1,000 $\mu$F (100 $\mu$F preferred). The second switching device 142 may comprise an IGBT, such as type 1MBI300L-120 available from Collmer Semiconductors of Dallas, Tex. Alternatively, other types of switching devices, such as MOSFETs could also be used.

A third switching device 151 is connected in series between the emitter of second switching device 142 and the negative (−) output terminal of the combined regulator/pulsing circuit 110. The third switching device 151 is connected to the control system 146 and is responsive to a third switch actuation signal 157 produced thereby. The third switching device 151 may comprise an IGBT, such as type 1MBI300L-120 available from Collmer Semiconductors of Dallas, Tex. Alternatively, other types of switching devices, such as MOSFETs could also be used. Diode 153 may comprise a diode rated for 100 amperes (A) at 1,000 volts (V), such as type APT2X101D100J available from Advanced Power Technology, Inc., of Bend, Oreg. As will be described in greater detail below, the short power pulses 169 comprising power output signal 165 are produced when the third switching device 151 is in the non-conducting state.

The control system 146 produces the first and second switch actuation signals 154 and 156 based on the various current feedback signals 148 and 150 and based on the current set signal 152. In addition, the control system 146 produces a third switch actuation signal 157 for switching the third switching device 151 between the conducting and non-conducting states. The first and second switch actuation signals 154 and 156 produced by the control system 146 may be identical to the first and second switch actuation signals 54 and 56 utilized in the first embodiment 10. That is, the first switch actuation signal 154 may comprise a PWM signal that is slaved to the second switch actuation signal 156. The current output of the combined regulator/pulsing circuit 110 may be controlled by varying the width of the PWM signal 154, in the manner already described for the first embodiment. The third switch actuation signal 157 is used to control the third switching device 151 to produce the power output signal 165 having power pulses 169 and quiescent periods 167, as will be described in greater detail below.

The control system 146 may comprise any of a wide range of circuits (e.g., pulse generators) suitable for generating the first, second, and third switch actuation signals 154, 156, and 157 according to the requirements set forth above. Consequently, the present invention should not be regarded as limited to any particular control system or control system configuration. By way of example, in one preferred embodiment, the control system 146 may comprise a model no. UC3825 pulse generator circuit available from Unitrode Integrated Circuits Corporation of Merrimack, N.H.

A bias supply circuit 144 may be connected across the second capacitor 140 by a pair of conductors 186, 188 to maintain the net reverse charge on the second capacitor 140. For example, in one preferred embodiment, the bias supply circuit 144 maintains the charge across the second capacitor 140 so that it is in the range of about 30 to 150 volts. The bias supply circuit 144 may be identical to the bias supply circuit 44 shown and described above. Therefore, the bias supply circuit 144 utilized in the second embodiment 110 of the power supply will not be described in further detail.

The control system 146 may also include an arc detection circuit 166 to allow the power supply 110 to be operated in either the "passive" or "active" arc suppression modes. However, since the arc detection circuit 166 is identical to the arc detection circuit 66 that was shown and described above, the arc detection circuit 166 also will not be described in further detail.

The operation of the second embodiment 110 of the power supply having the combined regulator and pulsing circuit is similar to the operation of the first embodiment 10. When the power supply 110 is first activated, the control system 146 places the third switching device 151 in the non-conducting state and operates the first and second switching devices 132 and 142 to produce a DC output signal substantially as shown in FIG. 2c. The power supply 110 may be operated in this condition for any convenient length of time, in which case the power output to the chamber 114 may be substantially constant. If it is desired to pulse the output of the power supply to produce an output power signal 165 comprising a plurality of power pulses 169 followed by quiescent periods 167, then the control system 146 would operate the third switching device as necessary to achieve the desired power output signal 165.

For example, referring now to FIGS. 4 and 5, assume that the third switching device 151 is in the non-conducting state beginning at a time $t_1$. So long as the third switching device remains in the non-conducting state, the power supply 110 produces a DC output signal that is substantially identical to the DC output signal 64 shown in FIG. 2c. That is, the DC output signal may comprise a plurality of polarity reversing pulses 58. Then, suppose at a time $t_2$ it is desired to quickly terminate the power to the chamber 114. At this time (i.e., time $t_2$) the control system 146 places the third switching device 151 in the conducting state. This has the effect of short-circuiting the chamber 114, thereby almost instantly extinguishing the plasma 160. Of course, the current sensor 138 is used to limit the current of the power supply 110 when the third switching device 151 is in the conducting state. The power supply may be operated in this quiescent state 167 until a time $t_3$ when it is desired to again apply power to the chamber 114. Accordingly, the control system 146 returns the third switching device 151 to the non-conducting state. This process may be repeated any number of times and at any convenient frequency.

Figure 6:
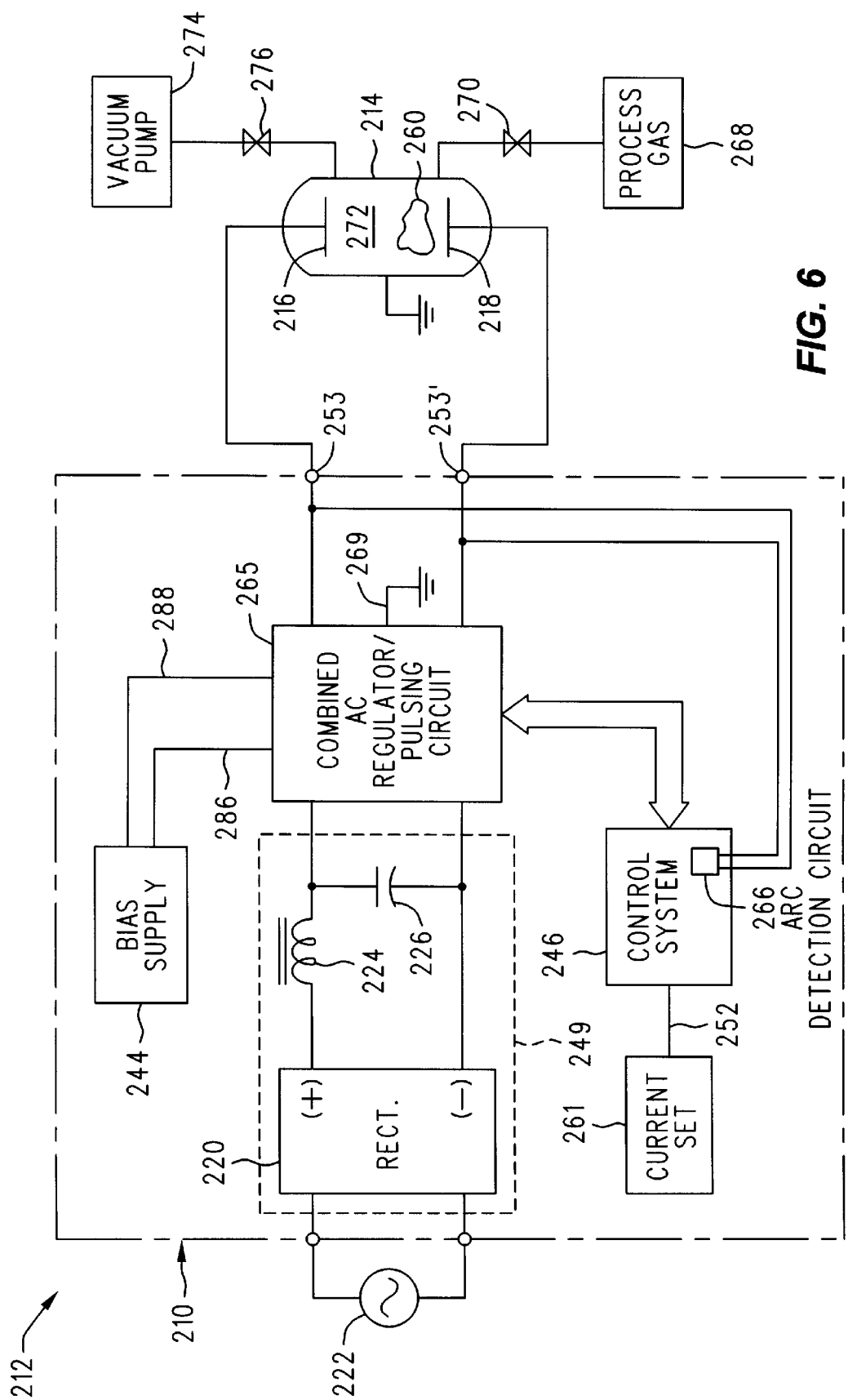
FIG. 6 is a block diagram of a third embodiment of the present invention that utilizes a combined AC regulator and pulsing circuit to produce an AC output signal.

A third embodiment 210 of a power supply according to the present invention is shown in FIG. 6 and may be used to produce a split phase alternating output current comprising a first phase 264 and a second phase 264'. See FIGS. 8(g) and 8(h). The split phase alternating output current may be utilized in any of a wide range of AC-type plasma processing systems, such as the "dual cathode" system 212 shown in FIG. 6. In such an application, the first phase 264 of the alternating output current is applied to a first electrode 216 via a first output terminal 253 of power supply 210. The second phase 264' of the alternating output current is provided to a second electrode 218 via a second output terminal 253'. Each phase 264, 264' of the alternating output current is also provided with a plurality of polarity reversing pulses 258, 258', respectively, which provide the advantages already described. The return path for each phase 264, 264' of the alternating output current is provided via ground node 269 or the other cathode (e.g., cathode 216 or 218 as the case may be).

A significant advantage of the third embodiment 210 is that it may be used to produce an alternating current output, thereby allowing it to be used in AC-type plasma processing systems, while retaining the advantages of the combined regulator/pulsing circuit described above, which produces a DC output signal. The third embodiment 210 therefore provides increased utility.

Before proceeding with a detailed description of the third embodiment 210, it should be noted that while the power supply circuit 210 is shown and described herein as it could be used in dual cathode plasma processing system 212, it is not limited to use solely with dual cathode type systems. To the contrary, the third embodiment 210 of the power supply could be used in any of a wide range of AC-type plasma processing systems wherein it would be desirable or advantageous to provide the plasma processing system with an alternating output current having a plurality of polarity reversal pulses 258, 258'.

Referring now primarily to FIG. 6, the dual cathode plasma processing system 212 may comprise a non-reactive sputter deposition system that may be used to deposit a thin film or coating (not shown) onto the surface of a substrate (not shown) positioned within the process chamber 214. Alternatively, the power supply 210 and dual cathode plasma processing system 212 could be used to accomplish other types of plasma processes, such as reactive sputter deposition processes. Accordingly, the present invention should not be regarded as limited to the non-reactive sputter deposition process that is shown and described herein.

Each electrode 216, 218 of the dual cathode plasma processing system 212 may comprise a separate cathode/target assembly. The anode may be provided by the process chamber 214 itself by connecting the chamber 214 to the ground node 269. Alternatively, the return path could be provided by the other cathode (e.g., 216 or 218, as the case may be). In accordance with the split phase alternating output current provided by the present invention 210, each cathode/target assembly (e.g., 216, 218) is sputtered when the voltage applied to each cathode/target assembly is sufficiently negative with respect to the anode to ignite the plasma 260. For example, in the embodiment shown and described herein, the first cathode/target 216 sputters when the first phase 264 of the alternating output current is negative (e.g., between times $t_0$ and $t_1$ in FIG. 8(g)), but does not sputter when the first phase 264 is substantially zero volts (e.g., between times $t_1$ and $t_2$). Conversely, the second cathode/target 218 does not sputter when the second phase 264' is substantially zero volts (e.g., between times $t_0$ and $t_1$ in FIG. 8(h)), but sputters when the second phase 264' is substantially negative (e.g., between times $t_1$ and $t_2$).

The cathode/target assemblies comprising the dual cathodes 216, 218 may comprise planar magnetron cathode/target assemblies of the type shown and described in U.S. Pat. No. 5,262,028 which has already been incorporated herein by reference for all that it discloses. Alternatively, other types of cathode/target assemblies, such as non-planar magnetrons or even regular (i.e., non-magnetron) diode sources could also be used. Accordingly, the present invention should not be regarded as limited to any particular type of cathode/target assembly.

In accordance with its use to accomplish non-reactive sputter deposition processes, the process chamber 214 may include a process gas supply 268 which contains a supply of a suitable process gas (not shown), such as argon. A process gas valve 270 connected between the process gas supply 268 and the process chamber 214 may be used to regulate the flow of process gas into the interior 272 of process chamber 214. A vacuum pump assembly 274 and a vacuum valve assembly 276 may be used to maintain the interior 272 of process chamber 214 at a pressure or within a range of pressures suitable for carrying out the desired process.

Since process chambers and the various ancillary systems and devices associated therewith are well-known in the art and could be easily provided by persons having ordinary skill in the art, the process chamber 214 and related ancillary systems and devices (e.g., process gas supply 268, vacuum pump assembly 274, etc.) will not be described in further detail.

If it is desired to configure the plasma processing system 212 to accomplish reactive sputter deposition, the process chamber 214 may also be provided with a reactant gas source (not shown) that contains a supply of a suitable reactant gas. A reactant gas valve (not shown) may be used to regulate the flow of the reactant gas into the interior 272 of process chamber 214. However, since such additional systems and devices required to accomplish reactive sputter deposition processes are also well-known in the art and could be provided by persons having ordinary skill in the art, the additional systems and devices that may be required or desired to accomplish reactive sputter deposition also will not be described in further detail herein.

Figure 7:
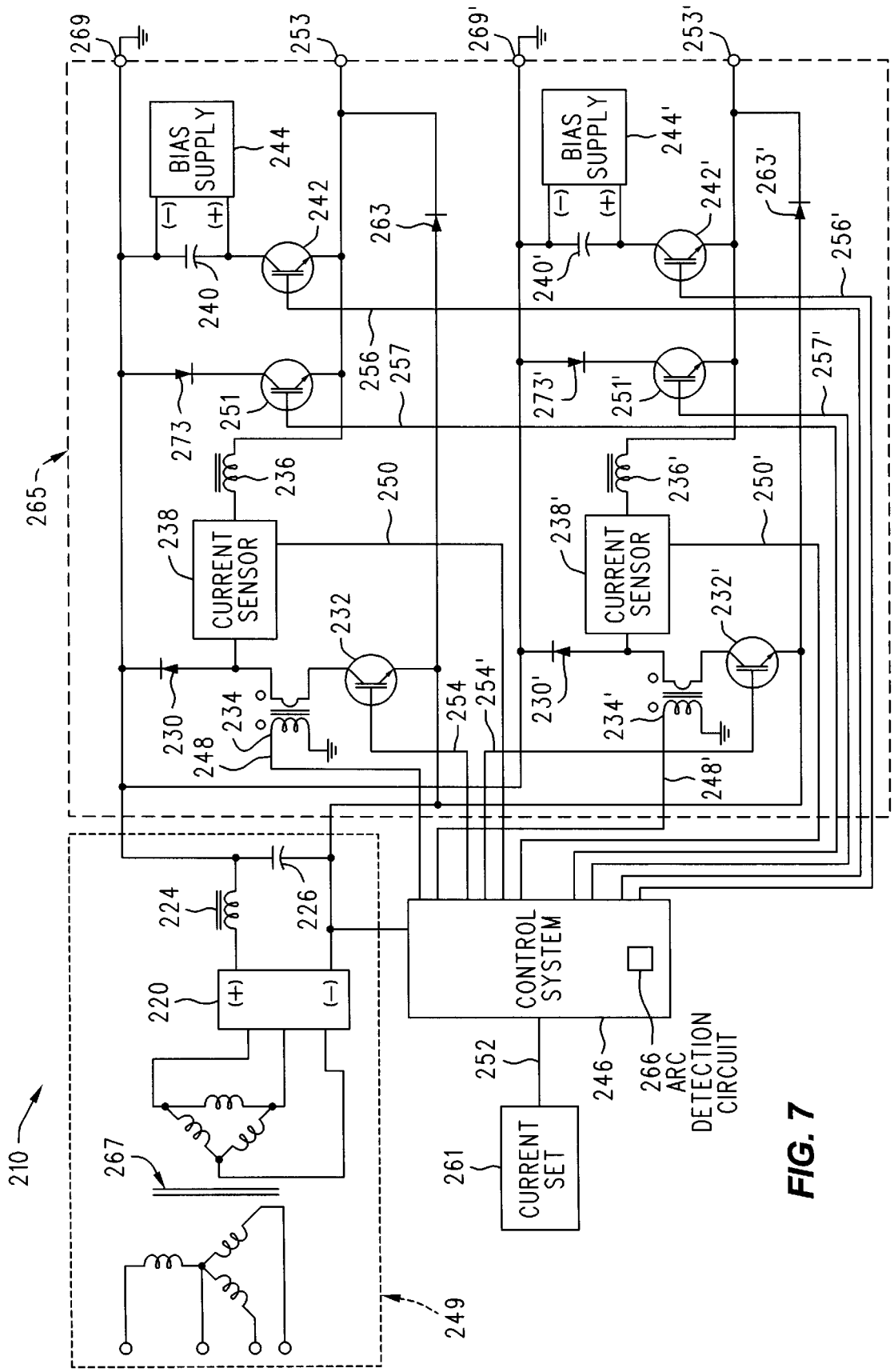
FIG. 7 is a schematic representation of the combined AC regulator and pulsing circuit shown in FIG. 6.

Referring now primarily to FIG. 7, the power supply 210 may comprise a DC power supply section 249 for supplying the combined AC regulator/pulsing circuit 265 with direct current. In one preferred embodiment, the DC power supply section 249 may comprise a rectifier assembly 220 which converts alternating current (AC) produced by an alternating current source 222 (FIG. 6) to a direct current (DC) suitable for use by the combined AC regulator/pulsing circuit 265. The alternating current source 222 may comprise a conventional 240 volt, 3-phase, 60 Hz alternating current supply in which case the rectifier circuit 220 may comprise a conventional 3-phase rectifier assembly to convert the 3-phase AC into DC. If desired, the AC produced by the alternating current source 222 may be isolated from the power supply by placing a conventional wye-delta (Y-Δ) transformer 267 between the alternating current source 222 and the rectifier circuit 220.

In an alternate embodiment, the alternating current source 222 may comprise a single phase AC supply in which case the rectifier circuit 220 would comprise a rectifier assembly suitable for converting single phase AC into DC. In any event, since rectifier circuits for converting 3-phase or single phase alternating current into direct current are well-known, the rectifier circuit 220 used in one preferred embodiment will not be described in further detail herein.

The DC power supply section 249 may also include an inductor 224 and a capacitor 226 connected in series across the positive (+) and negative (−) terminals of the rectifier circuit 220. The inductor 224 and capacitor 226 add inductive and capacitive reactance to the DC power supply section 249 to help dampen the power fluctuations resulting from the operation of the combined AC regulator/pulsing circuit 265. The inductor 224 and capacitor 226 may comprise any of a wide range of values depending on the design voltage and power levels of the particular power supply 210. In one preferred embodiment, the inductor 224 may have an inductance in the range of about 0.3 millihenrys (mH) to 10 mH (1.0 mH preferred), and the capacitor 226 may have a capacitance in the range about 100 microfarads ($\mu$F) to 100,000 $\mu$F (1,000 $\mu$F preferred).

The combined AC regulator/pulsing circuit 265 may comprise two combined regulator/pulsing circuits of the type described for the second embodiment 110, with each circuit producing one phase (i.e., first phase 264 or second phase 264') of the split phase alternating output current. For example, in the embodiment shown and described herein, the first phase 264 (FIG. 8(g)) of the alternating output current is produced between output terminals 269 and 253 (FIG. 7), whereas the second phase 264' (FIG. 8(h)) is produced between output terminals 269' and 253'. Output terminals 269 and 269' may be connected together and serve as the ground node 269 shown in FIG. 6.

The combined AC regulator/pulsing circuit 265 may comprise a first diode 230 and a first switching device 232 connected in series across capacitor 226. The first switching device 232 is also connected to the control system 246 and is responsive to a first switch actuation signal 254 (also shown in FIG. 8(a)) produced thereby. The first switch actuation signal 254 switches the first switching device 232 between a conducting or closed state and a non-conducting or open state. In one preferred embodiment, the first switching device 232 is placed in the open or non-conducting state when the first switch actuation signal 254 is in the "low" state. Conversely, the first switching device 232 is placed in the closed or conducting state when the first switch actuation signal 254 is in the "high" state. The first switching device 232 provides a current regulating function to the first phase 264 of the alternating output current, as will be described in greater detail below.

An optional current sensing transformer 234 may be connected in series between first diode 230 and first switching device 232. Current sensing transformer 234 produces a current feedback signal 248 that is indicative of the current flowing in the first switching device 232. The current feedback signal 248 may be monitored by the control system 246, which may be programmed to open the first switching device 232 if the current flowing in the first switching device 232 exceeds the maximum safe rating for that device. Alternatively, the control system 246 could be programmed to turn-off the entire power supply 210 should such a condition occur.

A first inductor 236 is connected between the anode of first diode 230 and the second output terminal 253 of the power supply circuit 210. A current sensor 238 may be connected in series between the anode of first diode 230 and the first inductor 236. Current sensor 238 produces a current feedback signal 250 that is indicative of the current flowing in the first inductor 236. The control system 246 utilizes the current feedback signal 250 to regulate the output current of the first phase 264 of the alternating output current.

A first capacitor 240 and a second switching device 242 are connected in series across the first output terminal 269 and second output terminal 253. The second switching device 242 is also connected to the control system 246 and is responsive to the second switch actuation signal 256 (also shown in FIG. 8(b)) produced thereby. The second switching device 242 is placed in the non-conducting or open state when the second switch actuation signal 256 is in the "low" state and is placed in the conducting or open state when the second switch actuation signal 256 is in the "high" state. The second switching device 242 provides the polarity reversing pulses 258 (FIG. 8(g)) to the first phase 264 of the alternating output current, as will be described in greater detail below.

A third switching device 251 and a third diode 273 are connected in series across the first and second output terminals 269 and 253. The third switching device 251 is also connected to the control system 246 and is responsive to the third switch actuation signal 257 (also shown in FIG. 8(c)) produced thereby. The third switching device 251 is placed in the non-conducting or open state when the third switch actuation signal 257 is in the "low" state and is placed in the conducting or closed state when the third switch actuation signal 257 is in the "high" state.

As will be explained in greater detail below, the third switching device 251 "enables" and "disables" the first phase 264 of the output signal. That is, when the third switching device 251 is non-conducting, the first phase 264 is "enabled" and is held at a negative voltage $V_1$. This condition is illustrated in FIG. 8(g) between times $t_0$ and $t_1$. When the third switching device 251 is placed in the conducting state, the first phase signal 264 is clamped substantially to zero volts (i.e., "disabled"), as shown in FIG. 8(g) between times $t_1$ and $t_2$.

A diode 230' and a fourth switching device 232' are also connected in series across capacitor 226. The fourth switching device 232' is also connected to the control system 246 and is responsive to a fourth switch actuation signal 254' (also shown in FIG. 8(d)) produced thereby. The fourth switching device 232' is placed in the open or non-conducting state when the fourth switch actuation signal 254' is in the "low" state and is placed in the closed or conducting state when the fourth switch actuation signal 254' is in the "high" state. The fourth switching device 232', like the first switching device 232, provides a current regulating function, as will be described in greater detail below.

An optional current sensing transformer 234' may be connected in series between diode 230' and fourth switching device 232'. Current sensing transformer 234' provides a current feedback signal 248' to the control system 246 that is related to the current flowing in the fourth switching device 232'. The current feedback signal 248' may be monitored by the control system 246, which may be programmed to open the fourth switching device 232' if the current in the fourth switching device 232' exceeds the maximum current rating for that device. Alternatively, the control system 246 may be programmed to turn-off the entire power supply 210.

The diodes 230, 230', first and fourth switching devices 232, 232' and current sensing transformers 234 and 234' may comprise any of a wide range of components and devices depending on the particular application and on the voltages and currents at which the power supply 210 is to be operated. For example, in one preferred embodiment, the diodes 230 and 230' may comprise diodes rated at 1,000 volts (V) and 100 amperes (A), such as type APT2X101D100J available from Advanced Power Technology, Inc., of Bend, Oreg. The first and fourth switching devices 232 and 232' may comprise insulated gate bi-polar transistors (IGBTs), such as type 1MBI300L-120 available from Collmer Semiconductors of Dallas, Tex. Alternatively, other types of switching devices, such as metal oxide field effect transistors (MOSFETs) could also be used. The current feedback transformers 234 and 234' may comprise current transformers having turns ratios of about 200:1, such as type D1871 available from Coil Craft of Cary, Ill, although other types of transformers or current sensing devices could also be used.

A second inductor 236' is connected between the anode of diode 230' and the fourth output terminal 253' of the power supply circuit 210. A current sensor 238' may be connected in series between the anode of diode 230' and the second inductor 236'. Current sensor 238' produces a current feedback signal 250' that is indicative of the current in the second inductor 236'. Control system 246 utilizes the current feedback signal 250' to regulate the current of the second phase 264' of the alternating output current.

The first and second inductors 236 and 236' may have any of a wide range of inductances depending on the particular circuit, application, and other extrinsic factors. In one preferred embodiment, the first and second inductors 236 and 236' both have inductances of about 500 microhenrys ($\mu$H). The current sensors 238 and 238' may comprise model nos. LA305-S current sensors available from LEM USA, Inc., of Milwaukee, Wis.

A second capacitor 240' and a fifth switching device 242' are connected in series across the third output terminal 269' and fourth output terminal 253'. The fifth switching device 242' is also connected to the control system 246 and is responsive to the fifth switch actuation signal 256' (also shown in FIG. 8(e)) produced thereby. The fifth switching device 242' is placed in the non-conducting or open state when the fifth switch actuation signal 256' is in the "low" state and is placed in the conducting or open state when the fifth switch actuation signal 256' is in the "high" state. The fifth switching device 242' provides the polarity reversing pulses 258' to the second phase 264' (FIG. 8(h)) of the alternating output current, as will be described in greater detail below.

The first and second capacitors 240 and 240' and the second and fifth switching devices 242 and 242' may comprise any of a wide range of values and types depending on the particular circuit, intended application, and other extrinsic factors. By way of example, the first and second capacitors 240 and 240' may have capacitances in the range of about 10 microfarads ($\mu$F) to 1000 $\mu$F (100 $\mu$F preferred). The second and fifth switching devices 242 and 242' may comprise IGBTs, such as type 1MBI300L-120 available from Collmer Semiconductors of Dallas, Tex. Alternatively, other types of switching devices, such as MOSFETs could also be used.

A sixth switching device 251' and a diode 273' are connected in series across the third and fourth output terminals 269' and 253'. The sixth switching device 251' is also connected to the control system 246 and is responsive to a sixth switch actuation signal 257' (also shown in FIG. 8(f)) produced thereby. The sixth switching device 251' is placed in the non-conducting or open state when the sixth switch actuation signal 257' is in the "low" state and is placed in the conducting or closed state when the sixth switch actuation signal 257' is in the "high" state.

The sixth switching device 251' "enables" and "disables" the second phase 264' of the alternating output current. That is, when the sixth switching device 251' is conducting, the second phase 264' is "disabled" and is clamped at substantially zero volts, as indicated between times $t_0$ and $t_1$ in FIG. 8(h). Conversely, the second phase signal 264' is "enabled" and is maintained at a negative voltage $V_1$' when the sixth switching device 251' is placed in the non-conducting state, such as, for example, between times $t_1$ and $t_2$ in FIG. 8(h).

The third and sixth switching devices 251 and 251' may comprise IGBTs, such as type 1MBI300L-120 available from Collmer Semiconductors of Dallas, Tex. Alternatively, other types of switching devices, such as MOSFETs could also be used. Diodes 273 and 273' may comprise diodes rated for 1,000 volts (V) and 100 amperes (A) such as type APT2X101D100J available from Advanced Power Technology, Inc., of Bend, Oreg.

The control system 246 produces the first, second, third, fourth, fifth, and sixth switch actuation signals 254, 256, 257, 254', 256' and 257' based on the various current feedback signals 248, 248', 250 and 250' and based on a current set signal 252. The current set signal 252 may be generated by a current set circuit 261 based on a user-selected input for a desired current level.

The first switch actuation signal 254 produced by the control system 246 may comprise a pulse width modulated (PWM) signal having a variable pulse width 262. Since the first switching device 232 is placed in the conducting state when the PWM signal 254 is in the "high" state, longer pulse widths 262 correspond to higher output currents of the first phase 264 of the alternating output current. Conversely, shorter pulse widths 262 correspond to lower output currents. The PWM signal 254 is synchronized with, or slaved to, the second switch actuation signal 256 so that the first switch actuation signal 254 can only go in the "high" state when the second signal 256 goes "low." This condition is illustrated in FIGS. 8(a) and 8(b).

The fourth and fifth switch actuation signals 254' and 256' are analogous to the first and second switch actuation signals 254 and 256 described above. That is, the fourth switch actuation signal 254' may comprise a PWM signal having a variable pulse width 262' which controls the output current of the second phase 264' of the alternating output current. The fourth switch actuation signal 254' is slaved to the fifth switch actuation signal 256' so that the fourth switch actuation signal 254' can only go "high" when the fifth signal 256' goes "low." This condition is illustrated in FIGS. 8(c) and 8(d).

The third and sixth switch actuation signals 257 and 257' are used to enable and disable the first and second phases 264 and 264', respectively, of the alternating output current. That is, when the third switch actuation signal 257 is "low," the third switching device 251 is placed in the non-conducting or open state, which "enables" the first phase output signal 264. The non-conducting third switching device 251 allows the circuit 265 to produce the first phase 264 of the alternating output current. In one preferred embodiment, the first phase 264 comprises a negative voltage at substantially $V_1$ (e.g., −500 volts) with a plurality of polarity reversal pulses 258. The plurality of polarity reversal pulses 258 result from the switching of the second switching device 242 by the second switch actuation signal 256. The foregoing condition is illustrated in FIGS. 8(b) and 8(g) between times $t_0$ and $t_1$.

When the third switch actuation signal 257 is "high," the third switching device 251 is placed in the conducting state, which "disables" the first phase signal 264, clamping it to substantially zero (0) volts. See FIGS. 8(c) and 8(g) between times $t_1$ and $t_2$.

The sixth switch actuation signal 257' has an identical effect on the operation of the sixth switching device 251' and the second phase output signal 264'. That is, when the sixth switch actuation signal 257' is "low," the sixth switching device 251' is open or non-conducting, which "enables" the second phase output signal 264'. Stated another way, the non-conducting sixth switching device 251' allows the circuit 265 to produce the second phase output signal 264' comprising a negative voltage $V_1'$ (e.g., −500 volts) with a plurality of polarity reversal pulses 258'. The plurality of polarity reversal pulses 258' are the result of the switching of the fifth switching device 242' by the fifth switch actuation signal 256'. See FIGS. 8(e) and 8(h) between times $t_1$ and $t_2$.

When the sixth switch actuation signal 257' is "high," the sixth switching device 251' is placed in the conducting state, which clamps substantially to zero (0) volts the second phase output signal 264'. See FIGS. 8(f) and 8(h) between times $t_0$ and $t_1$.

The control system 246 alternately switches between the third and sixth switch actuation signals 257 and 257' so that when one signal is "low" (e.g., signal 257) the other is "high" (e.g., signal 257'). This alternate switching enables one phase (e.g., the first phase 264) of the alternating output current to be enabled while the other phase (e.g., the second phase 264') is disabled and vice-versa.

The control system 246 may comprise any of a wide range of circuits (e.g., pulse generators) suitable for generating the first, second, third, fourth, fifth, and sixth switch actuation signals 254, 256, 257, 254', 256' and 257' according to the criteria described herein. Consequently, the present invention should not be regarded as limited to any particular control system or control system configuration. By way of example, in one preferred embodiment the control system 246 may comprise a combination of two (2) model no. UC3825 pulse generators available from Unitrode Integrated Circuits Corp. of Merrimack, N.H., and associated circuitry to allow the two pulse generators to operate in the manner just described. However, since the associated circuitry required to combine the two pulse generators to function in the foregoing manner would be obvious to persons having ordinary skill in the art after having become familiar with the teachings of the present invention, the associated circuitry required to combine the two pulse generators will not be described in further detail herein.

The control system 246 may be provided with an arc detection circuit 266 to allow the power supply 210 to be operated in either a "passive" or an "active" arc suppression mode, as described above for the first two embodiments. The arc detection circuit 266 may be identical to the arc detection circuit 66 shown and described above.

A pair of bias supply circuits 244 and 244', each of which may comprise a relatively simple regulated power supply of the type shown and described for the first two embodiments 10 and 110, may be provided to maintain the net reverse charges on the capacitors 240 and 240' within a predetermined range (e.g., 30 to 150 volts). Alternatively, a single bias supply circuit could also be used.

The operation of the third embodiment 210 is similar to the operation of the first two embodiments 10 and 110 and is best understood by considering the following hypothetical example and by referring to FIGS. 8(a–h). Assume that the power supply 210 has already been activated and has achieved steady state operation by a time $t_0$. At this time (i.e., at time $t_0$), the first phase output 264 is "enabled" while the second phase output 264' is "disabled." The output current of the first phase output 264 is controlled by the first switch actuation signal 254 (FIG. 8(a)). That is, the control system 246 lengthens or shortens (i.e., modulates) the width 262 of first switch actuation signal 254 as necessary to maintain the output current in the first inductor 236 at the desired level. The desired level may be selected by the current set point 252. See FIGS. 6 and 7.

Each polarity reversal pulse 258 associated with the first phase output 264 is produced by the second switching device 242. That is, each of the "high" pulses of the second switch actuation signal 256 (FIG. 8(b)) results in a corresponding polarity reversal pulse 258.

Suppose now that at a time $t_1$ it is desired to disable the first phase output 264 and enable the second phase output 264'. This is accomplished by simultaneously switching the third switch actuation signal 257 from the "low" state to the "high" state and the sixth switch actuation signal 257' from the "high" state to the "low" state. The "high" signal pulses comprising second output signal 256 are also discontinued at this time (i.e., at time $t_1$), which terminates the polarity reversal pulses 258. That is, the second switch actuation signal 256 switches to the "low" state and remains in the "low" state until a time $t_2$. The first switch actuation signal 254 enters a minimum current mode, i.e., the width 262 of each pulse 254 is set to the minimum value. This minimizes the current flowing through diode 273 and third switching device 251.

At the same time the first phase output 264 is disabled, as described above, the second phase output 264' is enabled. That is, the sixth switch actuation signal 257' switches the sixth switching device 251' to the non-conducting or open state. The current provided by the second phase output 264' is regulated by varying the widths 262' of the "high" pulses of the fourth switch actuation signal 254'. The polarity reversal pulses 258' on the second phase signal 264' are generated each time the fifth switch actuation signal 256' switches to the "high" state. The power supply 210 continues to operate in this second mode of operation until a time $t_2$, at which time the control system 246 switches back to the first mode of operation (i.e., as illustrated in the times between $t_0$ and $t_1$).

The control system 246 alternates between the two modes of operation described above to produce the split phase alternating output current comprising the first phase 264 and the second phase 264'. The control system 246 may be programmed to switch between the two modes at any convenient frequency. In one preferred embodiment, the control system 246 switches between the two modes at a frequency in the range of about 10 kHz to 50 kHz (20 kHz to 30 kHz preferred). Accordingly, the alternating output current will have the same frequency. The polarity reversal pulses 258, 258' associated with each respective phase 264, 264' of the alternating output current may have durations in the range of about 1 microsecond ($\mu$s) to 5 $\mu$s (2 $\mu$s preferred) and may be produced at frequencies in the range of about 15 kilohertz (kHz) to 300 kHz (40 kHz preferred).

As was the case for the first two embodiments 10 and 110, the third embodiment 210 may be operated in an active arc suppression mode, in which case a polarity reversal pulse (e.g., 258 or 258' as the case may be) is produced whenever an arc condition is detected by the arc detection circuit 266.

It is contemplated that the inventive concepts herein described may be variously otherwise embodied and it is intended that the appended claims be construed to include alternative embodiments of the invention except insofar as limited by the prior art.

What is claimed is:

1. A circuit for producing an alternating output current having a first phase and a second phase, comprising:
    a first current regulator for producing the first phase and for regulating the current of the first phase;
    a second current regulator for producing the second phase and for regulating the current of the second phase; and
    a control system operatively associated with said first and second current regulators for controlling the operation of said first and second current regulators.

2. A circuit for producing an alternating output current having a first phase and a second phase, comprising:
    a first current regulator for producing the first phase and for regulating the current of the first phase;
    a first polarity reversing circuit operatively associated with said first current regulator for periodically reversing the polarity of the first phase;
    a second current regulator for producing the second phase and for regulating the current of the second phase;
    a second polarity reversing circuit operatively associated with said second current regulator for periodically reversing the polarity of the second phase; and
    a control system operatively associated with said first and second current regulators and said first and second polarity reversing circuits for controlling the operation of said first and second current regulators and said first and second polarity reversing circuits.

3. The circuit of claim 2, wherein said first current regulator comprises:
    a first diode having a cathode and an anode, the cathode of said first diode being electrically connected to a positive terminal of a supply of direct current, the cathode of said first diode also being electrically connected to a first output terminal of said circuit;
    a first switching device electrically connected between the anode of said first diode and a negative terminal of the supply of direct current, said first switching device being switchable between a conducting state and a non-conducting state; and
    a first inductor electrically connected between the anode of said first diode and a second output terminal of said circuit.

4. The circuit of claim 3, wherein said first polarity reversing circuit comprises:
    a first capacitor having a first plate and a second plate, the first plate of said capacitor being electrically connected to the first output terminal; and
    a second switching device electrically connected between the second plate of said first capacitor and the second output terminal, said second switching device being switchable between a conducting state and a non-conducting state.

5. The circuit of claim 4, further comprising a third switching device electrically connected between the first output terminal and the second output terminal, said third switching device being switchable between a conducting state and a non-conducting state.

6. The circuit of claim 5, wherein said second current regulator comprises:
    a second diode having a cathode and an anode, the cathode of said second diode being electrically connected to the positive terminal of the supply of direct current, the cathode of said second diode also being electrically connected to a third output terminal of said circuit;
    a fourth switching device electrically connected between the anode of said second diode and the negative terminal of the supply of direct current, said fourth switching device being switchable between a conducting state and a non-conducting state; and
    a second inductor electrically connected between the anode of said second diode and a fourth output terminal of said circuit.

7. The circuit of claim 6, wherein said second polarity reversing circuit comprises:
    a second capacitor having a first plate and a second plate, the first plate of said second capacitor being electrically connected to the third output terminal; and
    a fifth switching device electrically connected between the second plate of said second capacitor and the fourth output terminal, said fifth switching device being switchable between a conducting state and a non-conducting state.

8. The circuit of claim 7, further comprising a sixth switching device electrically connected between the third and fourth output terminals, said sixth switching device being switchable between a conducing state and a non-conducting state.

9. The circuit of claim 8, further comprising a first current sensor connected in series between the anode of said first diode and said first inductor for sensing a current flowing in said first inductor and for producing a first current feedback signal related thereto, wherein said control system is operatively associated with said first current sensor and responsive to the first current feedback signal, said control system operating said first switching device between the conducting and non-conducting states to regulate the current flowing in said first inductor.

10. The circuit of claim 9, further comprising a second current sensor connected in series between the anode of said second diode and said second inductor for sensing a current flowing in said second inductor and for producing a second current feedback signal related thereto, wherein said control system is operatively associated with said second current sensor and responsive to the second current feedback signal, said control system operating said fourth switching device between the conducting and non-conducting states to regulate the current flowing in said second inductor.

11. The circuit of claim 10, further comprising a first bias supply circuit connected across the first and second plates of said first capacitor for maintaining a voltage potential across the first and second plates within a predetermined range of voltage potentials.

12. The circuit of claim 11, further comprising a second bias supply circuit connected across the first and second plates of said second capacitor for maintaining a voltage potential across the first and second plates within a predetermined range of voltage potentials.

13. A circuit for placing an alternating current on a first electrode and a second electrode positioned within a process chamber, comprising:

a first diode having a cathode and an anode, the cathode of said first diode being electrically connected to a positive terminal of a supply of direct current, the cathode of said first diode also being electrically connected to a first output terminal of said circuit;

a first switching device electrically connected between the anode of said first diode and a negative terminal of the supply of direct current, said first switching device being switchable between a conducting state and a non-conducting state;

a first inductor electrically connected between the anode of said first diode and a second output terminal of said circuit;

a first capacitor having a first plate and a second plate, the first plate of said capacitor being electrically connected to the first output terminal;

a second switching device electrically connected between the second plate of said first capacitor and the second output terminal, said second switching device being switchable between a conducting state and a non-conducting state;

a third switching device electrically connected between the first output terminal and the second output terminal, said third switching device being switchable between a conducting state and a non-conducting state;

a second diode having a cathode and an anode, the cathode of said second diode being electrically connected to the positive terminal of the supply of direct current, the cathode of said second diode also being electrically connected to a third output terminal of said circuit;

a fourth switching device electrically connected between the anode of said second diode and the negative terminal of the supply of direct current, said fourth switching device being switchable between a conducting state and a non-conducting state;

a second inductor electrically connected between the anode of said second diode and a fourth output terminal of said circuit;

a second capacitor having a first plate and a second plate, the first plate of said second capacitor being electrically connected to the third output terminal;

a fifth switching device electrically connected between the second plate of said second capacitor and the fourth output terminal, said fifth switching device being switchable between a conducting state and a non-conducting state;

a sixth switching device electrically connected between the third and fourth output terminals, said sixth switching device being switchable between a conducing state and a non-conducting state; and a control system operatively associated with said first, second, third, fourth, fifth, and sixth switching devices for switching said first, second, third, fourth, fifth, and sixth switching devices between the conducting and non-conducting states.

14. The circuit of claim 13, wherein the first and third output terminals are electrically grounded and wherein the second output terminal is electrically connected to the first electrode and wherein the fourth output terminal is electrically connected to the second electrode.

15. The circuit of claim 13, further comprising a third diode connected in series with said third switching device and a fourth diode connected in series with said sixth switching device.

16. The circuit of claim 15, further comprising a first current sensor connected in series between the anode of said first diode and said first inductor for sensing a current flowing in said first inductor and for producing a first current feedback signal related thereto, wherein said control system is operatively associated with said first current sensor and responsive to the first current feedback signal produced thereby, said control system operating said first switching device between the conducting and non-conducting states to regulate the current flowing in said first inductor.

17. The circuit of claim 16, further comprising a second current sensor connected in series between the anode of said second diode and said second inductor for sensing a current flowing in said second inductor and for producing a second current feedback signal related thereto, wherein said control system is operatively associated with said second current sensor and responsive to the second current feedback signal produced thereby, said control system operating said fourth switching device between the conducting and non-conducting states to regulate the current flowing in said second inductor.

18. The circuit of claim 17, further comprising a first bias supply circuit connected across the first and second plates of said first capacitor for maintaining a voltage potential across the first and second plates within a predetermined range of voltage potentials.

19. The circuit of claim 18, further comprising a second bias supply circuit connected across the first and second plates of said second capacitor for maintaining a voltage potential across the first and second plates within a predetermined range of voltage potentials.

20. The circuit of claim 19, wherein said control system includes an arc detection circuit for detecting an arc condition in the process chamber and wherein said control system places the second and fifth switching devices in the conducting states when an arc condition is detected.

21. The circuit of claim 20, further comprising:

a first switching device current sensor operatively associated with said first switching device, said first switching device current sensor producing a first switching device current feedback signal related to current flowing in said first switching device and wherein said control system is operatively associated with said first switching device current sensor and responsive to the first switching device current feedback signal produced thereby, said control system placing said first switching device in the non-conducting state if the current in said first switching device exceeds a predetermined maximum current; and a second switching device current sensor operatively associated with said fourth switching device, said second switching device current sensor producing a second switching device current feedback signal related to current flowing in said fourth switching device and wherein said control system is operatively associated with said second switching device current sensor and responsive to the second switching device current feedback signal produced thereby, said control system placing said fourth switching device in the non-conducting state if the current in said fourth switching device exceeds a predetermined maximum current.

22. A method for producing an alternating current output having a first phase and a second phase, the first and second phases each including a plurality of polarity reversal pulses, comprising the steps of:

providing a first current regulator for producing the first phase and for regulating the current of the first phase and a second current regulator for producing the second phase and for regulating the current of the second phase;

providing a first polarity reversing circuit for periodically reversing the polarity of the first phase and a second polarity reversing circuit for periodically reversing the polarity of the second phase;

alternately switching the first and second current regulators between an enabled state and a disabled state so that when the first current regulator is in the enabled state the second current regulator is in the disabled state and vice-versa;

activating the first polarity reversing circuit and deactivating the second polarity reversing circuit when the first current regulator is in the enabled state and the second current regulator is in the disabled state; and deactivating the first polarity reversing circuit and activating the second polarity reversing circuit when the first current regulator is in the disabled state and the second current regulator is in the enabled state.

23. A combined regulator and pulsing circuit for regulating a current flowing between a first electrode and a second electrode and for reversing a voltage polarity across the first and second electrodes, comprising:

a first diode having a cathode and an anode, the cathode of said first diode being electrically connected to a positive terminal of a supply of direct current, the cathode of said first diode also being electrically connected to a first output terminal of said combined regulator and pulsing circuit, the first output terminal being adapted to be electrically connected to the first electrode;

a first switching device electrically connected between the anode of said first diode and a negative terminal of the supply of direct current, said first switching device being switchable between a conducting state and a non-conducting state;

an inductor electrically connected between the anode of said first diode and a second output terminal of said combined regulator and pulsing circuit, the second output terminal being adapted to be electrically connected to the second electrode;

a capacitor having a first plate and a second plate, the first plate of said capacitor being electrically connected to the first output terminal;

a second switching device having a first lead connected to the second plate of said capacitor, said second switching device being switchable between a conducting state and a non-conducting sate;

a third switching device connected in series between a second lead of said second switching device and the second output terminal, said third switching device being switchable between a conducting state and a non-conducting state; and a control system operatively associated with said first, second, and third switching devices for switching said first, second, and third switching devices between the conducting and non-conducting states.

24. The circuit of claim 23, further comprising a second diode between the first output terminal and the second lead of said second switching device.

25. A combined regulator and pulsing circuit for regulating a current flowing between a first electrode and a second electrode and for reversing a voltage polarity across the first and second electrodes, comprising:

a supply of direct current having a positive output terminal and a negative output terminal;

a first inductor having a first end lead and a second end lead, the first end lead of said first inductor being electrically connected to the positive output terminal of said supply of direct current;

a first capacitor electrically connected in series between the second lead of said first inductor and the negative terminal of said supply of direct current;

a first diode having a cathode and an anode, the cathode of said first diode being electrically connected to the second end lead of said first inductor, the cathode also being electrically connected to a first output terminal of said combined regulator and pulsing circuit, the first output terminal being adapted to be electrically connected to the first electrode;

a first switching device electrically connected in series between the anode of said first diode and the negative terminal of said supply of direct current, said first switching device being switchable between a conducting state and a non-conducting state;

a second inductor electrically connected in series between the anode of said first diode and a second output terminal of said combined regulator and pulsing circuit, the second output terminal being adapted to be electrically connected to the second electrode;

a second capacitor having a first plate and a second plate, the first plate of said second capacitor being electrically connected to the cathode of said first diode;

a second switching device having a first lead connected to the second plate of said second capacitor, said second switching device being switchable between a conducting state and a non-conducting sate;

a third switching device connected in series between a second lead of said second switching device and the second output terminal, said third switching device being switchable between a conducting state and a non-conducting state; and a control system operatively associated with said first switching device, said second switching device, and said third switching device for operating said first, second, and third switching devices in the conducting and non-conducting states.

26. The circuit of claim 25, further comprising a second diode between the first output terminal and the second lead of said second switching device.

* * * * *